United States Patent [19]

Nakabayashi et al.

[11] Patent Number: 5,454,050
[45] Date of Patent: Sep. 26, 1995

[54] CUT MASK PREPARATION METHOD AND APPARATUS

[75] Inventors: Natsuko Nakabayashi, Edogawa; Hideaki Kobayashi, Tokyo; Kazuhiko Tanaka, Shiki, all of Japan

[73] Assignee: Dai Nippon Insatsu Kabushiki Kaisha, Tokyo, Japan

[21] Appl. No.: 355,320

[22] Filed: Dec. 13, 1994

Related U.S. Application Data

[63] Continuation of Ser. No. 942,139, Sep. 8, 1992, abandoned, which is a continuation of Ser. No. 630,222, Dec. 19, 1990, abandoned.

[30] Foreign Application Priority Data

| Dec. 20, 1989 | [JP] | Japan | 1-330133 |
| Dec. 28, 1989 | [JP] | Japan | 1-340452 |
| Jan. 16, 1990 | [JP] | Japan | 2-6647 |
| Feb. 19, 1990 | [JP] | Japan | 2-38104 |
| Jun. 15, 1990 | [JP] | Japan | 2-156699 |

[51] Int. Cl.⁶ .................................................. G06K 9/38
[52] U.S. Cl. ......................... 382/165; 382/171; 382/199
[58] Field of Search .................................. 382/16, 17, 18, 382/22, 33, 50, 51, 52; 358/515, 517, 464

[56] References Cited

U.S. PATENT DOCUMENTS

| 4,648,120 | 3/1987 | Chittineni | 382/22 |
| 4,741,046 | 4/1988 | Matsunawa et al. | 382/51 |
| 4,868,884 | 9/1989 | Miyazaki et al. | 382/22 |
| 4,908,872 | 3/1990 | Toriu et al. | 382/18 |
| 4,969,202 | 11/1990 | Groezinger | 382/22 |
| 5,038,383 | 8/1991 | Ushumoto et al. | 382/22 |
| 5,091,967 | 2/1992 | Ohsawa | 382/33 |
| 5,119,440 | 6/1992 | Duenyas et al. | 382/33 |

FOREIGN PATENT DOCUMENTS 1-298477  12/1989  Japan ........................ G06F 15/70

Primary Examiner—Leo H. Boudreau
Assistant Examiner—Phuoc Tran
Attorney, Agent, or Firm—Oliff & Berridge

[57] ABSTRACT

In a cut mask preparation method of displayed image on a screen of display means to prepare a cutting mask, an area lying across a real region and a background region is designated as a training area, for picture elements in which area a YMC three plate histogram is prepared to determine a threshold through discrimination analysis. A plate among the three plates, which has a maximum estimating function used upon the threshold determination, is used and binary-coded with said threshold to prepare a mask for a picture element included in one between the binary-coded values.

3 Claims, 25 Drawing Sheets

DESIGNATE A AS BACKGROUND

?: COORDINATE AXIS, ANY WILL DO; FOR EXAMPLE YIQ MAY BE USED.

TRAINING AREA

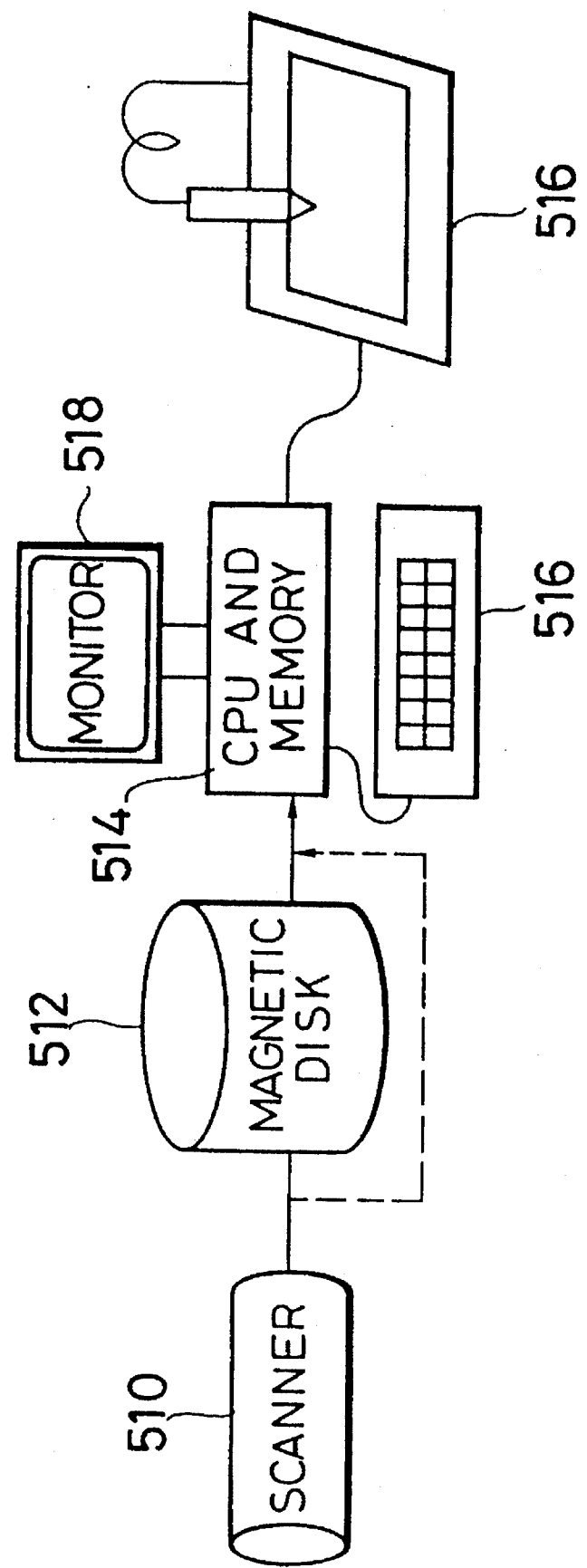

FIG. 27

| CLUSTER No. | Y | | M | | C | |
|---|---|---|---|---|---|---|
| | min | max | min | max | min | max |
| A | 0 | 255 | 0 | 255 | 0 | 255 |
| B ← NEXT CLUSTER | | | | | | |
| | | | | | | |

CUT MASK PREPARATION METHOD AND APPARATUS

This is a Continuation of application Ser. No. 07/942,139 filed Sep. 8, 1992 now abandoned, which in turn is a continuation of application Ser. No. 07/630,222 filed Dec. 19, 1990, now abandoned.

BACKGROUND OF THE INVENTION

1. Field of the Invention

The present invention relates to a cut mask preparation method and an apparatus therefor, and more particularly to a cut mask preparation method and an apparatus therefor for preferably preparing a cut mask by displaying color image data on a display screen for the purpose of preparing a printing/process film, or for preferably electronically cutting a necessary real region with a cut mask to extract the real region from a background region on the color image data.

2. Description of the Prior Art

For preparing a film of a printing/process original plate from color image data, there is sometimes met an occasion where a cut mask is formed for a unnecessary region (an background image region for example) and is used to cut a necessary real region. For instance, a cutting process is commonly employed in a case, for example, where only a necessary portion is cut out of a photographic document for its use, in cases where a square photographic document is trimmed therein into a heart shape for its use or in cases where an object in a photographic document is extracted and then synthesized with another photographic document for its use.

There are conventionally known varieties of techniques to prepare such a cut mask. In one technique, input image data is displayed on a display screen, the image on which is observed by an operator who in turn precisely designates a contour line of an object image to be cut and cuts the same.

In another technique, an operator indicates the color of a region which he is desirous to cut (a background region) while observing an image displayed on a display screen, whereby a cut line is automatically prepared.

In another further technique, an operator designates part of a background region which he is desirous to mask while observing an image displayed on a display screen, and he finds a change in the density of the region, whereby a cut line is automatically extracted on the basis of a density distribution that is yielded in consideration of a density change.

Further, in other techniques, the contour of a required picture pattern is traced onto a layout paper with a tracing machine for designation of cutting, or a tracing paper is placed on a photographic document to permit the contour of a necessary portion of the document to be written thereon and an unnecessary portion of the document to be smeared with a hatch for designation of cutting, whereby a cut mask and the like are prepared for synthesis in accordance with the resulting cutting designation.

However, printed matters include, in addition to those comprising a single color area, those gradually changing in colors, negative and positive films for color photography, and so on. Accordingly, for preparing a film plate by extracting only a particular object in such a color document such as a person or a furniture, etc., for example, there are overlapped regions of different luminosity, saturation, hue, so that the foregoing techniques fail to automatically prepare any faithful film plate.

For this reason, for any color film document, a desired film plate (Y, H, C, Bk) of the color document is manually prepared by projecting a film image of the document, preparing a mask corresponding to a cut area with the aid of an operator, and superimposing the film document and the resulting mask. This causes difficulties such that the efficiency of preparing a film plate is lowered owing to a complicated image of the film document and, hence, days required for a printing process are greatly increased, and so on.

To solve this, there is available the use of the maximum likelihood method. In the maximum likelihood method, a background region in an image, which is desirous to be cut, is designated by following steps. Namely, color image data corresponding the background region is read out to evaluate the mean density for each plate color and the covariance between plate colors. Further, the color image data is read out for each picture element and for each plate color to evaluate density distance data based on an identification function referring to the mean density for each plate color and the covariance between plate colors, and background region data is extracted referring to the density distance data and decided distance data.

The maximum likelihood method, however, also has a difficulty: in cases where a background is uniform, a cut image can be prepared by designating portions with the same picture element density which is called a density mask. However, in cases where the shadow of a real region is projected on the background region or where the background region has gradation (there are cases associated with each of luminosity, saturation and hue.), background portions at a plurality of proper locations must be designated resulting in an operator burdened with a load, and hence an unskilled operator fails to designate any proper background region.

To overcome such a difficulty, there is known a technique, as disclosed in Japanese laid-Open Patent Publication No. 1-298477, to achieve automatic cutting by primary component analysis and maximum likelihood method based on the density distribution of part in a background region. More specifically, a user determines an identification function based on the primary component analysis that estimates the axis of a density change based on the density distribution of a training area previously designated in the background region. Then, the user designates a predetermined region including the contour of an object region and substitutes each data in the predetermined region for the identification function to binary-code each data with the maximum likelihood method.

In the technique disclosed in the just-mentioned patent, however, there is a problem that the background region separated from the first primary component axis of the training area might be incorrectly judged as belonging to a real region. In a case, for example, where an elongated dense shadow lies in the vicinity of the contour, it is sometimes unlikely to designate the training area so as to include the shadow but without including the real entity. Although in such a case the background region could be judged to some extent by designating the training area not including the shadow and analyzing the chief component of the same, it is difficult to predict the background region when the color of the shadow is severely out of the first chief component axis of the distribution of the training area.

Furthermore, in a case where the background region has an image including two or more kinds of colors, the density distribution of the training area is greatly spread with a difficulty that the color or colors of the side of the real entity section might be incorrectly judged as belonging to that of the side of the background region.

Namely, in the technique to automatically prepare a cut line following the designation of colors, a color area similar to that of the background region which area is existent in the real entity region to be cut might be cut by mistake, and further the real entity region with any shadow, if existent, in the vicinity of the contour, might fail to be cut. Still more, in a case where any image which is difficult to be cut automatically is processed fully automatically, it takes much time for evaluation thereof and it fails to be correctly cut with much wasteful time for correction thereof.

Furthermore, in the technique to faithfully cut the background region following the contour line designated by an operator, as a matter of course it is time-consuming and laborious to the operator because of the need of designating the entire contour line of an image with use of a cursor and the like by the operator.

The present applicant has proposed an automatic cutting system in Japanese Patent Application No. 63-129997 as a technique associated with the present invention. The automatic cutting system is to prepare an estimation function by designating a background region as the training area and taking a first chief component axis (=direction of gradation) into consideration. The automatic cutting system however has some difficulties as follows: The system merely utilizes only information concerning the training area of the background region, so that a color range judged as belonging to the background region upon cutting the background region is likely to be narrowed and, hence, there is produced a color of the edge of the real entity region close to the background region left behind narrowed on the side of the background region when the real entity region is intended to be extracted by cutting with a result that there may be produced an unnatural contour line or a shadow portion may be judged incorrectly as belonging to the real entity region.

More specifically, this system, although dealing with the gradation and the shadow to some extent too, a concrete preparation method of the estimation function is different from that in the present invention, and the method has some points to be improved. More precisely, the system, which regards the training area as belonging to the background region even though the gradation of the training area is as extended as possible, may sometimes judge for any color quite different from the actual color of the training area to belong to the background region. The system therefore has a disadvantage that an unexpected color in the real entity region might be judged by mistake as belonging to the background region, thus leaving the need of improvement.

SUMMARY OF THE INVENTION

In view of the drawbacks with the prior art, it is an object of the present invention to provide a cut mask preparation method and a device therefor which are capable of extracting rapidly and accurately a desired real region image from a background region without causing an unnatural contour line after cutting or incorrectly judging a shadowed area.

To achieve the above object, the first invention provides a cut mask preparation method displaying color image data on a display screen of display means, the method comprising the steps of: designating with respect to the displayed image data a region including a contour between a real region desirous of being cut and a background region as a training area; estimating a threshold candidate for each color image data in the training area on the basis of an estimation function concerning an optimum threshold; defining as a threshold a threshold candidate of a color, that has a maximum estimation function, in each color picture element data; converting the picture element data of said color into binary data with said threshold, and preparing a cut mask on the basis of the background region of the binary picture element data.

The second invention provides a cut mask preparation apparatus including display means for color image data and evaluation means, the apparatus comprising designation means for designating as the training area a region including a contour between a real region desirous of being cut and a background region with respect to the image data displayed on said image display means; estimation means for estimating a threshold candidate on the basis of an estimation function concerning an optimum threshold with respect to each picture element data in said training area; binary means for defining as a threshold a threshold candidate of a color, that has a maximum estimation function, in each color picture element data; management means for managing said each color picture element data to binary with said threshold so as to convert the same to "1", "+0" binary picture element data, designation means for designating which binary picture element data "1" or "0" is to be the background region; and preparation means for preparing a cut mask based on the binary picture element data of the background region.

In the first and second inventions, for preparing a cut mask, an area including a contour between a real region desirous of being cut and a background region is designated as a training area with respect to image data displayed on a screen of the display means, and a threshold candidate is estimated with respect to each color picture element data in the training area on the basis of an estimation function concerning an optimum threshold, and further a threshold candidate of a color where the estimation function is maximum is assumed as a threshold in each color picture element data, and the picture element data of said color is converted to binary data with said threshold so as to prepare the cut mask on the basis of the background region of said binary picture element data.

In accordance with the first and second inventions, the threshold is regarded as a threshold candidate of a color, an estimation function of which is maximum, and picture element data of said color is converted to binary data, so that data to be processed is reduced and, hence, calculation load is reduced. This assures high speed preparation of a cut mask. Additionally, when an area of the background region and the real region where their respective picture element data have single colors designated as the training areas, it assures more rapid and more accurate mask preparation.

Herein, the choice of the threshold candidate can be performed on the basis of an estimation function of an optimum threshold as follows. Such an estimation function includes one disclosed, for example, in "Automatic threshold selection Based Upon Decision and Least Square Estimation" by Nobuyuki Otsu, Electrotelcommunication Society, Vol, J 65—D, No. 4 April 1980.

For instance, a density level of single color data of a given image is assumed to have a probability distribution such as a histogram of FIG. 1. Herein, the density level k is assumed to take any number from 0 to 255, and a probability P (k) that picture elements of the density level k are existent in the whole picture elements, the number of which is N, is expressed by the following equation (1):

$$P(k) = n(k)/N \qquad (1)$$

Herein, n (k) represents the number of the picture elements of the density level k.

The total average level $\mu_T$ and dispersion $\sigma_T$ of the picture elements are given by the following equations (2) and (3);

$$\mu_T = \sum_{k=0}^{255} k \times P(k) \tag{2}$$

$$\sigma_T = \sum_{k=0}^{255} (k - \mu_T)^2 \times P(k) \tag{3}$$

Then, a level L is assumed as a threshold, and cumulative frequencies $\omega(L)$ and $\mu(L)$ of the level (L) classified from O to L and from L+1 to 255 are expressed as the following equations (4) and (5):

$$\omega(L) = \sum_{k=0}^{L} P(k) \tag{4}$$

$$\mu(L) = \sum_{k=0}^{L} k \times P(k) \tag{5}$$

Occurrence probabilities $\omega_A$ and $\omega_B$ in the classification from O to L and that from L+1 are given by the following equations (6) and (7):

$$\omega A = \omega(L) \tag{6}$$

$$\omega B = 1 - \omega(L) \tag{7}$$

The mean levels $\mu_A$ and $\mu_B$ are given by the following equation (8) and (9):

$$\mu A = \mu(L)/\omega(L) \tag{8}$$

$$\mu B = \{\mu T - \mu(L)/1 - \omega(L)\} \tag{9}$$

As a reference to represent the appropriateness of the threshold, there is useable the ratio $\eta(L)$ of the total dispersion $\sigma_T^2$ to the dispersion $\sigma_O^2$ among clusters as expressed by the following equation (10).

$$\eta(L) = \sigma O^2 / \sigma T^2 \tag{10}$$

the ratio $\eta(L)$ is therefore taken as the estimation function of the optimum threshold.

Herein, the dispersion $\sigma_O^2$ among clusters is given by equation (11).

$$\sigma_0^2(L) = \omega_A\{\mu_A - \mu_T\}^2 + \omega_B(\mu_B - \mu_T)^2 \tag{11}$$
$$= \omega_A \cdot \omega_B \cdot (\mu_A - \mu_B)^2$$

A level L for which the estimation function $\eta(L)$ is maximum is taken as the optimum threshold in single color picture element data (i.e., threshold candidate). Herein, the total dispersion $\sigma_T^2$ remains unchanged in the estimation function $\eta(L)$ irrespective of the level L, so that the estimation function $\eta(L)$ is to be maximum when the dispersion $\sigma_O^2(L)$ among clusters is maximum. The threshold candidate can therefore be determined by evaluating the dispersion $\sigma_O^2(L)$ among cluster.

Now, the dispersion $\sigma_O^2(L)$ combined with the cumulative frequencies $\omega(L)$ and $\mu(L)$ gives the following equation (12):

$$\sigma_0^2(L) = \omega(L)\{1 - \omega(L)\} \times \mu(L)/\omega(L) - \tag{12}$$
$$\{\mu_T - \mu(L)\}^2 / \{1 - \omega(L)\}$$
$$= \{\mu_T\omega(L) - \mu(L)\}^2/\omega(L)\{1 - \omega(L)\}$$

The level L ranges from 0 to 255, and a level L where the dispersion $\sigma_O^2(L)$ is maximum in the range $0<\omega(L)<1$ is regarded as the threshold candidate.

Additionally, provided it is designated which is the background region in "1" and "0" with respect to the binary picture element data, there is produced no error in mask preparation, and hence, rapidness and accuracy can further be improved. Further, compared with the case where any of "1" and "0" is automatically judged, the just-mentioned situation reduces evaluation load and, hence, allows a cut mask to be prepared more rapidly.

The third invention provides a method of processing image data to electronically cut the same, comprising the steps of: designating part of a background region in an image as a training area; statistically analyzing image data in said training area with respect to chief components of the image data; preparing an estimating function which shows a possibility that an arbitrary color belongs to the background region, while providing allowable limitation to a magnifying power with which the image can be color can extend in the direction of the chief component; designating a region lying across a cutting line of the image; and substituting, with respect to all picture elements within the designated region, said picture element data for said estimating function to judge whether each said picture element belongs to either the background region or the real region.

The forth invention provides a cutting processing apparatus including image display means, image data input means, and calculation means, said apparatus comprising designation means for designating part of the background region in an image as a training area, estimating function preparation means for statistically analyzing the chief component of image data in the designated training area to prepare an estimating function which is to indicate a possibility that arbitrary color belongs to the background region with allowable limitation of a magnifying power with which the image can be extended in the direction of the chief component; designation means for designating a region lying across a cutting line on the image; decision means for substituting picture element data for the estimating function with respect to all picture element data in the designated region to decide whether said picture element belongs to either the background region or the real region; mask data preparation means for preparing mask data on the basis of picture elements judged as belonging to the background region.

In the third and fourth inventions, part of the background region in an image is designated as a training area, image data in which area is statistically analyzed as to a chief component to prepare an estimating function which is to indicate a possibility that arbitrary color belongs to the background region with an allowable limitation of a magnifying power with which the image can be extended in the direction of the chief component, and a region lying across an image cutting line is designated, and with respect to all picture elements in the designated region, said picture element data is substituted for the estimating function to decide whether said picture element belongs to either the background region or the real region.

Accordingly, since the estimating function is prepared on the basis of the image data in the training area with an allowable limitation of a magnifying power with which the image can be extended in the direction of the chief component, background colors up to a contour line outside the training area can be moderately estimated on the basis of the picture element information of the training area. Thus, there can be prepared an estimating function which is highly accurate and has little room for incorrect decision compared with the estimating function in Japanese Patent Application No. 63-129997 previously filed by the present applicant.

The real region and the background region are separated from each other with use of the estimating function prepared as such, so that even with the existence of any color or shadow similar to those in the background region, they are discriminatable with high precision as well as it can be eliminated to discriminate any color widely different from colors in the training area as belonging to the background region. A cutting line can thus be formed rapidly and accurately to extract a desired real region from an image.

For instance, picture element data $y$ is substituted for an estimating function f $(y)$ with the assumption of a positive real constant do as a threshold, and if a substituted estimating function value f $(y)$>do, then the associated picture element is decided as belonging to the real region, while if f $(y)$≦do, then it is decided as belonging to the background region. The cutting processing binary mask data can be achieved in which the mask data is assumed to be ON for a picture element decided as belonging to the background region while the mask data assumed to be OFF for one decided as belonging to the real region.

Herein, for the estimating function, use of a Mahalanobis Distance d may be convenient.

The Mahalanobis Distance d means a certain kind of distance from a point aimed at in a multi-dimensional space to an associated spatial distribution, and represents how the point aimed at is far away from the distribution when distribution condition such as its shape and so on are taken into consideration. A color space (for instance a cyan (C) axis, a magenta (H) axis, and a yellow (Y) axis) belongs to the multi-dimensional space and a certain distribution is also formed in a case where each picture element data in the training area is plotted on the color space. The Mahalanobis Distance d between a distribution and elements (picture element data) $y$ on the color space X is expressed as follows.

$$d^2 = (y-z,2)^t \text{Cov}^{-1} (y-z,2) \quad (21)$$

Herein, $y$ is an average (vector) of element x in a training area, Cov is a covariance matrix.

For instance, the Mahalanobis Distance Z in an one-dimensional distribution substantially corresponds to a deviation (value) σ: as follows.

$$\delta = Z*10+50 \quad (22)$$

Incidentally, the Mahalanobis Distance in a one-dimensional distribution is expressed in terms of standard deviation σ and elements X, etc., as $Z=(x-m)/\sigma$ which may sometimes be called a Z value.

A set of points having constant Mahalanobis Distances from the distribution forms an ellipsoid in a three-dimensional space. Accordingly, the aforementioned method, in which the Mahalanobis Distance is used, as the estimating function, for discrimination of the image with a certain threshold, is, in other words, equivalent to a processing in which a distribution of a background region sampled as a training area is surrounded in consideration of its shape, by a moderate ellipsoid and, hence, divided into inner and outer sections thereof. In a case, for example, where a color space distribution of an image shown in FIG. 9(A) is given as shown in FIG. 9(B), a situation in which the foregoing distribution is surrounded by an ellipsoid where the square of the Mahalanobis Distance d is 40 is likewise illustrated in FIG. 9(B). Herein, the average $y$ is calculated from the training area in FIG. 9(A), and the distribution of the training area is illustrated in FIG. 9(B).

However, although the image can be divided into the background region, and the real region provided the foregoing Mahalanobis distance d is used, without any modification as the estimating function f $(y)$, the following difficulty is experienced for further improving cutting accuracy.

The training area is not the whole of the background region but a region obtained by partially sampling the background region, and, hence, is not necessarily likely to be correctly estimated. Additionally, the training area is a region that specifies only part of the background region so as not to lie across the real region, and, hence, is unlikely to be designated just in the vicinity of a contour line between the real region and the background region. Further, in a pattern with any shadow there may sometimes appear any color other than those belonging to the training area near the contour line.

The present inventors performed varieties of investigations for solving such a difficulty and improving the accuracy and have found an estimating function of elements (picture element data) x that are taken arbitrarily in a color space X, as follows:

$$f( )^2 = \{R^{-1}P^{-1}( - )\}^t \Lambda^{-1} \times \{R^{-1}P^{-1}( - )\} \quad (23)$$

Herein, there is existent an equality: a codispersion matrix Cov=PΛP$^{-1}$ where Λ is a diagonal matrix where eigenvalues of the matrix Cov are arranged in order from larger ones, and P is an orthonormal matrix where eigenvectors for respective eigenvalues of the matrix Cov are arranged laterally as column vectors. The vectors $y$ and $\underline{y}$ are assumed to be represented by column vectors, and the right upper suffix t of the parenthesis denotes transportation (for instance, A$^t$ is a transposed matrix of A, and $y^t$ is one where column vectors are converted to row vectors).

Herein, with n being the dimension of the color space X, ro assumed one or more real constant numbers in real-valued matrix of n*n, R is a diagonal matrix which is, expressed as follows.

$$R = \begin{pmatrix} r_0 & & & O \\ & 1 & & \\ & & \ddots & \\ O & & & 1 \end{pmatrix} \quad (24)$$

Herein, if ro=1, then R is a unit matrix and hence is equal to the Mahalanobis Distance d of the equation (23).

The equation (24) is equivalent to a situation that an ellipsoid with the constant Mahalanobis Distance d is elongated ro times in the direction of first chief component axis as illustrated, for example, in FIG. 10. The elongation means that the direction of graduation in the training area known, and any color yielded by extending the gradation is also allowed as the background region. More specifically, the equation (23) is based upon a way of thinking that in a case where there appears any color other than those in the training area in the vicinity of the contour line, the training area would already be subjected thereinside to strong gradation directed to that color. Estimation by the equation (23) exhibits an advantage that on the basis of data in the training area, colors in the training area could be predicted.

Herein, provided the gradation in the training area is supposed to exist in the background region as far as it is extended, there is a case where any color quite different from those in the training area might also belong to the background color, with a fear that any unexpected color in the real region is mistakenly discriminated as being existent in the background region.

In the third and fourth inventions, allowable limitation is therefore provided on a magnification power with which any associated color is extended in the direction of the chief component axis, to prepare the estimating function. Hereby, any background color reaching up to a contour line outside the training area can be moderately estimated on the basis of the information of the training area and, hence, an estimating function capable of reduction or elimination of erroneous discrimination can be prepared.

The fifth invention provides a cut mask preparation method of calculating image data by electronically cutting the same, the method comprising the steps of: designating one or more of a real region in an image and one or more area of a background region in the same as training areas; statistically analyzing picture element data in each said training area to prepare for each said training area an estimating function which shows a possibility that an arbitrary color belongs to the background region or to the real region; designating an area of the image as an object to be cut; substituting, with respect to all picture elements in the designated area, data on said picture elements for said estimating function; deciding on the basis of the values of the estimating function for which each said data is substituted, whether each said picture element belongs to either the background region or the real region; and preparing mask data from picture elements decided as belonging to the background region.

The sixth invention provides a cut mask preparation apparatus including means for evaluating image data to electronically cutting the same, said apparatus comprising: designation means for designating one or more areas of a real region in an image and one or more area of a background region in the same as training areas; preparation means for statistically analyzing picture element data in each said training area to prepare, for each said training area, an estimating function which shows a possibility that any arbitrary color belongs to either the background region or the real region; designation means for designating an area of the image as an object to be cut; decision means for substituting, with respect to all picture elements in the designated area, data of said picture element for said estimating function to decide whether said picture element belongs to either the background region or the real region from each estimating function value for which said data is substituted; and preparation means for preparing mask data on the basis of picture elements decided as belonging to the background region.

In the fifth and sixth inventions, for preparing a cut mask, one or more anew of a real region in an image and one or more areas of a background region in the same are designated as training areas. Picture element data in each designated training area is statistically analyzed to prepare for each said training area an estimating function which shows a possibility that any arbitrary color belongs to the background region or to the real region. On the other hand, an area of the image as an object is designated, and with respect to all picture elements in the designated area, data of said picture element is substituted for said estimating function to decide whether said picture element belongs to either the background region or the real region on the basis of the value of each substituted estimating function. Mask data is prepared from the picture element decided as belonging to the background region.

Accordingly, since both informations in the background region and the real region are utilized to prepare a cut mask, there can be eliminated the fears that there might be produced an unnatural contour line where any color on the side of the background region is left behind narrowed at a portion which formed a contour upon cutting or that any shadow portion might be decided by mistake as belonging to the real regions side, and hence a rapid and accurate cutting can be achieved.

The seventh invention provides a cut mask preparation method of processing image data to electronically cut the same, said method comprising the steps of: designating one or more of training areas each lying across a background region and a real region both in an image; statistically analyzing image data in said training area to prepare an estimating function which shows a possibility that an arbitrary color belongs to the background region or the real region; designating an area lying across a background region and a real region of the image both desirous of being cut; substituting with respect to all picture elements in the designated area data on said picture elements for said estimating function to decide whether said picture element belongs to either the background region or the real region; and preparing the mask data from said picture element decided as belonging to the background region.

The eighth invention provides a cutting mask preparation method for preparing said estimating function, according to the seventh invention, said method comprising the steps of: dividing all picture element data in the training area to two or more clusters; displaying each divided cluster with representative color thereof; selecting a cluster to be regarded as the background region or the real region from said displayed color; and preparing for each cluster an estimating function which shows a possibility that an arbitrary color belongs to each other.

In the seventh invention, one or more training areas lying across the background region and the real region of an image are designated, image data in said training area is statistically analyzed in for example a parameter space (color space) to prepare an estimating function which shows a possibility that an arbitrary color belongs to the background region or the real region, and with respect to all picture elements in an area of the image desirous of being cut (hereinafter, called a cutting area) lying across the background region a decision is made whether and the real region, each said picture element belongs to between the background region and the real region.

Accordingly, since the training area is designated as lying across the background region and the real region, the estimating function can accurately be determined to cut an object image to be cut automatically, effectively, and with less discrimination error.

For determination of the estimating function the eight invention is useable, for example. More specifically, first, all picture element data in the training area are divided to two or more clusters. Hereby, a cluster corresponding to a picture element data distribution can be yielded.

Then, each said divided cluster is displayed by a representative color thereof. Hereby, there is achieved a processing corresponding to conversion of picture element data to multi-values.

Further, on the basis of the displayed color, a cluster to be regarded as belonging to the background region or the real region is selected to prepare for each cluster an estimating function which shows a possibility that an arbitrary color belongs to said cluster. Each picture element data is substituted for the resulting estimating function and a closest cluster is selected by calculation. If the closest cluster belongs to the background region, then picture elements in that cluster are decided as belonging to the background region, while if it belongs to the real region, then the picture elements in that cluster are decided as belonging to the real region, and the decisions are binary-coded.

An image having a background region and a real region both including a plurality of colors can therefore be cut accurately. Particularly, the method is suitable for cutting an object having shadow.

Additionally, since a training area and an area lying across a cutting line are defined as separate areas, the training area can be reduced. Hereby, the amount of calculation for the clustering is restricted to reduce processing time, for achieving effective processing.

Additionally, such clustering enables image data which is given originally in multi-dimension can be processed as it is. The present method therefore has less information loss compared with a clustering method wherein an image is projected onto a certain axis on a color space and processed as a one-dimensional distribution. Thus, highly accurate cutting is assured.

The ninth invention provides a cut mask preparation method of preparing a cut mask by displaying color image data on a screen of display means, said method comprising the steps of: designating a training area for said displayed image data; performing a discrimination analysis of a histogram on each axis in a color space for the image data in said training area and classifying said image data on an axis having a high degree of separation on the basis of a result of said discrimination analysis, for clustering of said image data, repeatedly until a classification termination condition holds; designating a cluster among the divided clusters, said cluster belonging to belong to the background region; binary-coding an object area to be cut on the basis of the designated background region cluster to prepare the cut mask.

In the cut mask preparation method of the ninth invention, a training area is designated for image data displayed on the display means, a discrimination analysis of a histogram is performed with respect to image data in the training area on each axis in a color space, and, simultaneously, the image data is classified on an axis having a high degree of separation on the basis of a result of said discrimination analysis for clustering thereof, repeatedly until a classification termination condition holds, a cluster among classified clusters which is to belong to the background region is designated; and, on the basis of the designated background region cluster, an object area to be cut is binary-coded to prepare the cut mask.

Accordingly, since clustering is achieved with arithmetic operation of the discrimination analysis of a histogram, the clustering processing can be speeded up. Additionally, a cut mask can be prepared only with comparison of said cluster with image data in the object area to be cut. Thus, a cut mask can be prepared effectively at a high speed with less calculation.

BRIEF DESCRIPTION OF THE DRAWINGS

The above and other objects, features and advantages of the present invention will become more apparent from the following description of the invention taken in conjunction with the accompanying drawings, wherein like reference characters designate the same or similar parts, and wherein:

FIG. 21 is a front view partly including a perspective view, illustrating arrangement of a cut mask preparation apparatus associated with a preferred embodiment of the ninth invention;

FIG. 27 is likewise a diagram illustrating a cluster table;

DESCRIPTION OF THE PREFERRED EMBODIMENTS

In what follows, a preferred embodiment of the present first and second invention will be described in detail with reference to the accompanying drawings.

Figure 1:
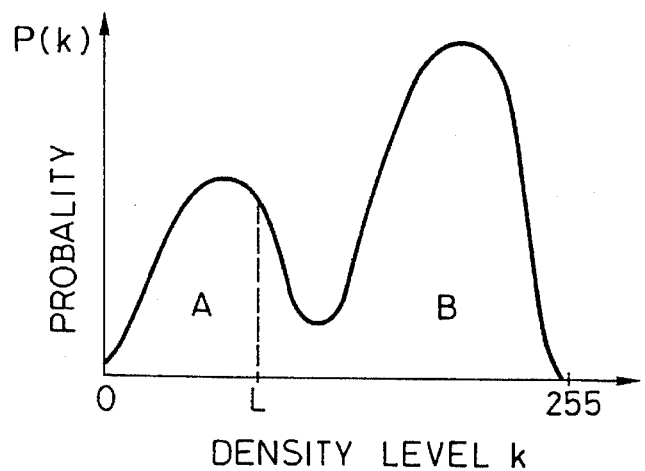
FIG. 1 is a diagram illustrating a histogram of a density level in the first and second inventions.
Figure 2:
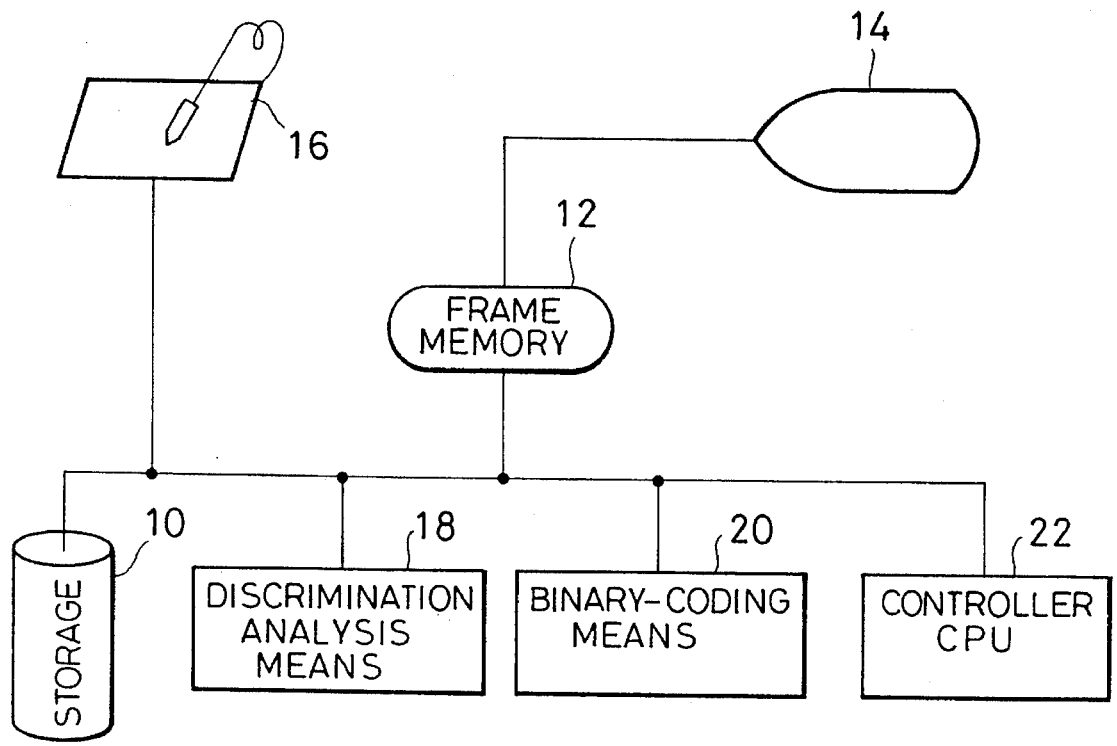
FIG. 2 is a block diagram illustrating the arrangement of a cut mask preparation apparatus according to preferred embodiments of the first and second invention.

In the present preferred embodiment, there is provided a cut mask preparation apparatus arranged as illustrated in FIG. 2 for preparing a cut mask of color image data for printing makeup of yellow (Y), magenta (M), and cyan (C) by displaying the data on a screen of display means (14).

As illustrated in FIG. 2, the cut mask preparation apparatus comprises a storage 10 for storing therein color image data, a frame memory 12 for storing therein a one screen fraction of the image data in the storage 10, a color cathode ray tube (CRT) 14 for displaying the image data in the frame memory 12 on a screen thereof, a digitizer (or mouth) 16 for designating, with respect to the image data displayed on the color CRT 14, an area including a contour between a real region and a background region desirous of being cut, as a training area, discrimination analysis means 18 for estimating by the foregoing equations (1) through (12) threshold candidates of picture element data of each C, M, Y color plate with respect the picture elements in the training area in conformity with an instruction from the digitizer 16 to determine as a threshold a threshold candidate giving a maximum estimating function among the threshold candidates of respective colors, binary-coding means 20 for binary-coding picture element data of the color (the color giving the maximum estimating function) in the training area with the determined threshold; and a controller CPU 22 for preparing mask data from background region picture element data designated on the digitizer 16 among the binary-code image data.

Figure 3:
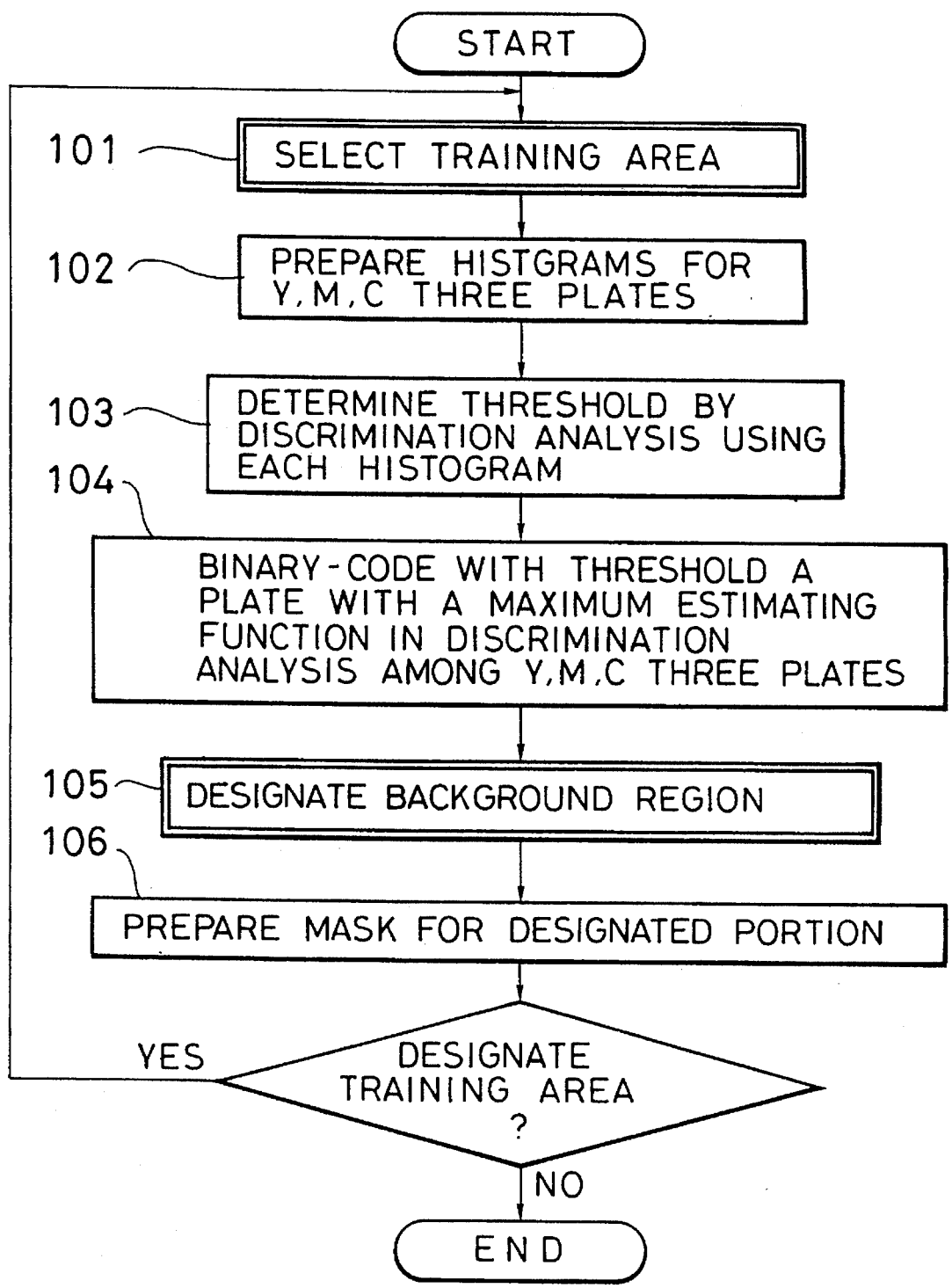
FIG. 3 is a flowchart illustrating mask preparation procedures in said embodiments.

The present preferred embodiment of the first and second invention has the above arrangement and prepares a mask data with the procedure illustrated in FIG. 3.

Figure 4:
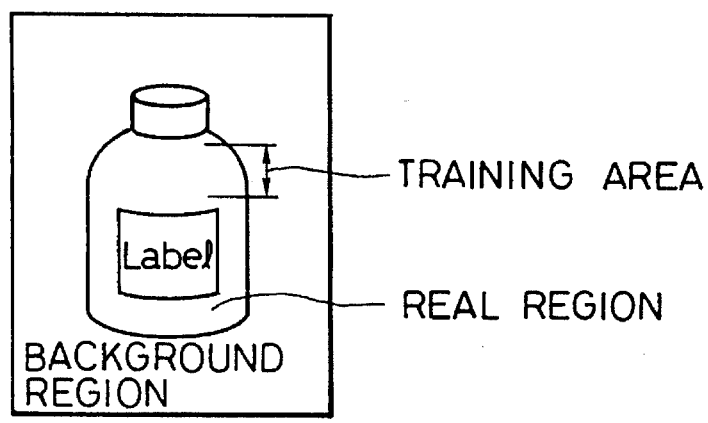
FIGS. 4 through 7 are plan views or diagrams each illustrating image data examples for describing operations of said embodiment.

More specifically, in step 101, with a situation where a color image to be cut has been displayed on the color CRT 14, an operator designates as a training area an area of the color image on the CRT 14 screen, the area being desirous of being cut and lying across a real region and a background region and further including a contour between those real and background regions, using the digitizer 16, as illustrated in FIG. 4 for example. The configuration of the training area may be arbitrary, say, one making a round of the real region if it has a less color change.

Figure 5:
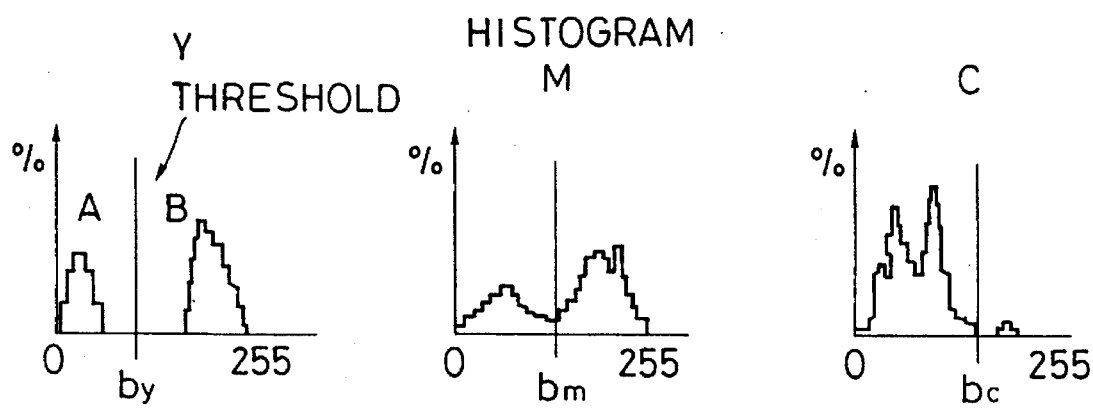

Then, in step 102, the discrimination analysis means 18 determines threshold candidates $1y$, $1m$, $1c$ with respect to picture elements in the training area and for picture element data of C, H and Y colors, using the foregoing equations (1) through (12) on the basis of the histogram illustrated in FIG. 5 for example.

Then, in step 103, the discrimination analysis means 18 determines, with respect to the threshold candidates $1y$, $1m$ and $1c$ of the respective colors, a threshold candidate as a threshold, the threshold candidate having a maximum estimating function among estimating functions $\eta y$ max, $\eta m$ max and $\eta c$ max of the above threshold candidates. In FIG. 5, there is satisfied an inequality: $\eta y$ max>$\eta m$ max>$\eta c$ max, and, hence, the threshold is one of the y plate.

Figure 6:
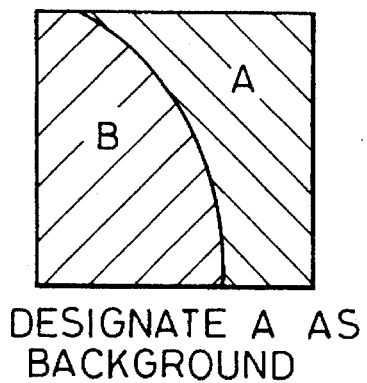

Then, in step 104, the binary-coding means 20 binary-codes picture element data of the color plate having the foregoing maximum estimating function (Y plate in the case of FIG. 5) among the C, H, Y three color plate image data with use of the determined threshold, as illustrated in FIG. 6. Then, in step 105, the operator selects and designates which belongs to the background region in the binary-coded picture element data "1", "0". For example, in FIG. 6, A is designated as the background.

Figure 7:
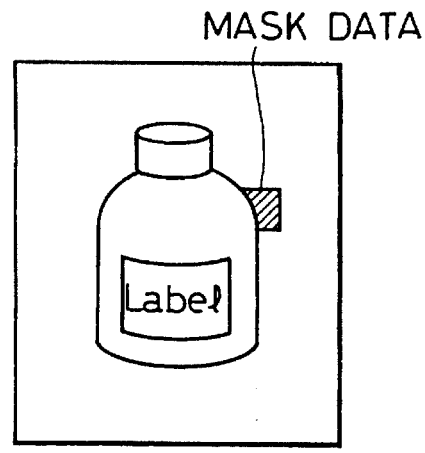

Then, in step 106, mask data is prepared on the basis of picture elements included in the designated area as illustrated in FIG. 7, and the mask data is displayed on the screen for confirmation.

Hereby, a mask is prepared with respect to the training area (i.e., cutting area). In the case where another training area is designated successively, the operation returns to step 101 to prepare a mask, while with no designation, the operation completed.

Figure 8:
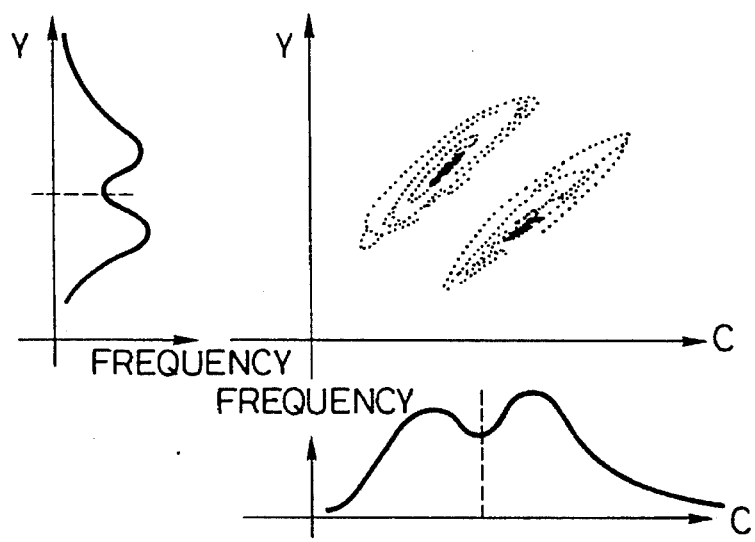
FIG. 8(A) and (B) are diagrams each illustrating coordinate axis conversion of image data for estimating a threshold upon execution of the first and second inventions.
Figure 8:
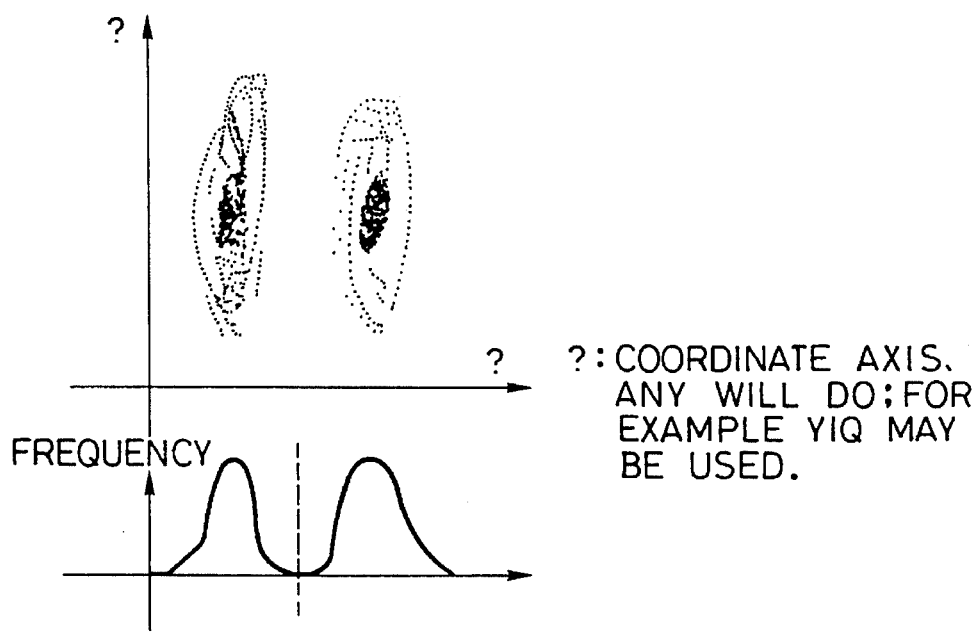
Figure 9A:
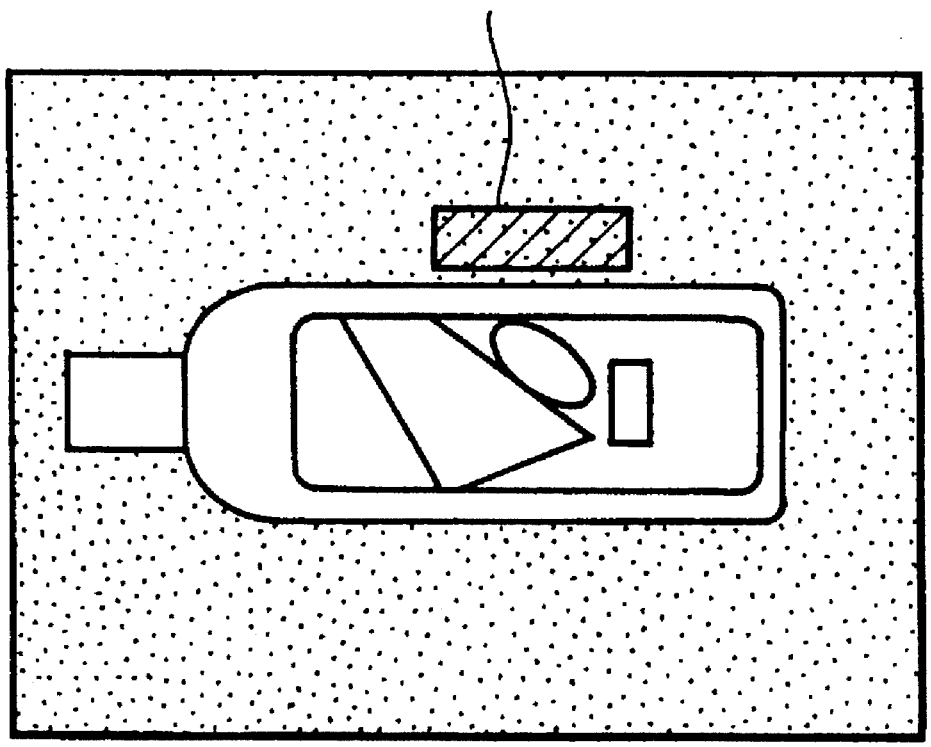
FIGS. 9(A) and (B) are a plan view and a diagram for illustrating a situation where a training area and a picture element data distribution of the same are surrounded on the basis of a Mahalanobis Distance, for describing the principles of the third and fourth inventions.
Figure 9:
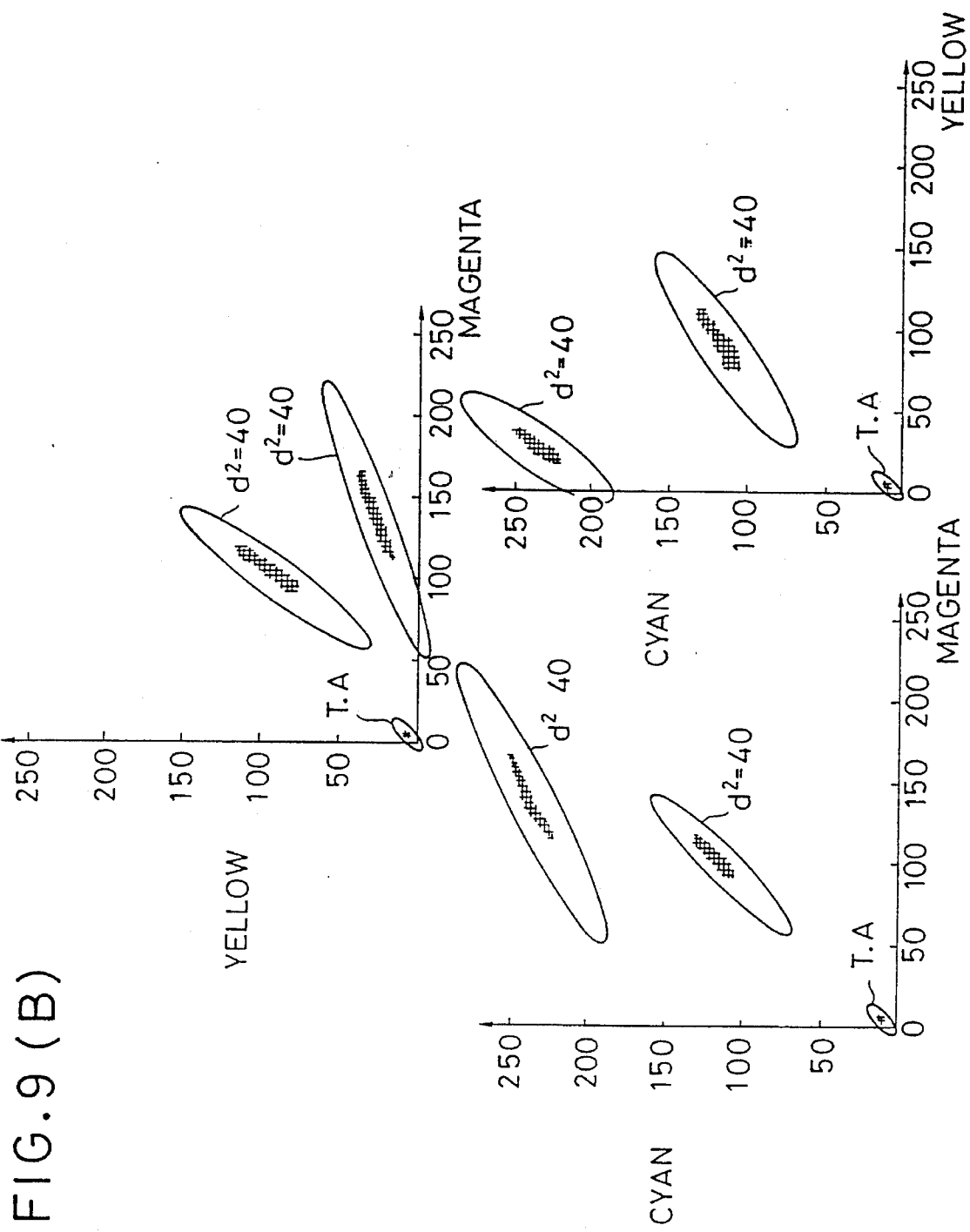
Figure 10:
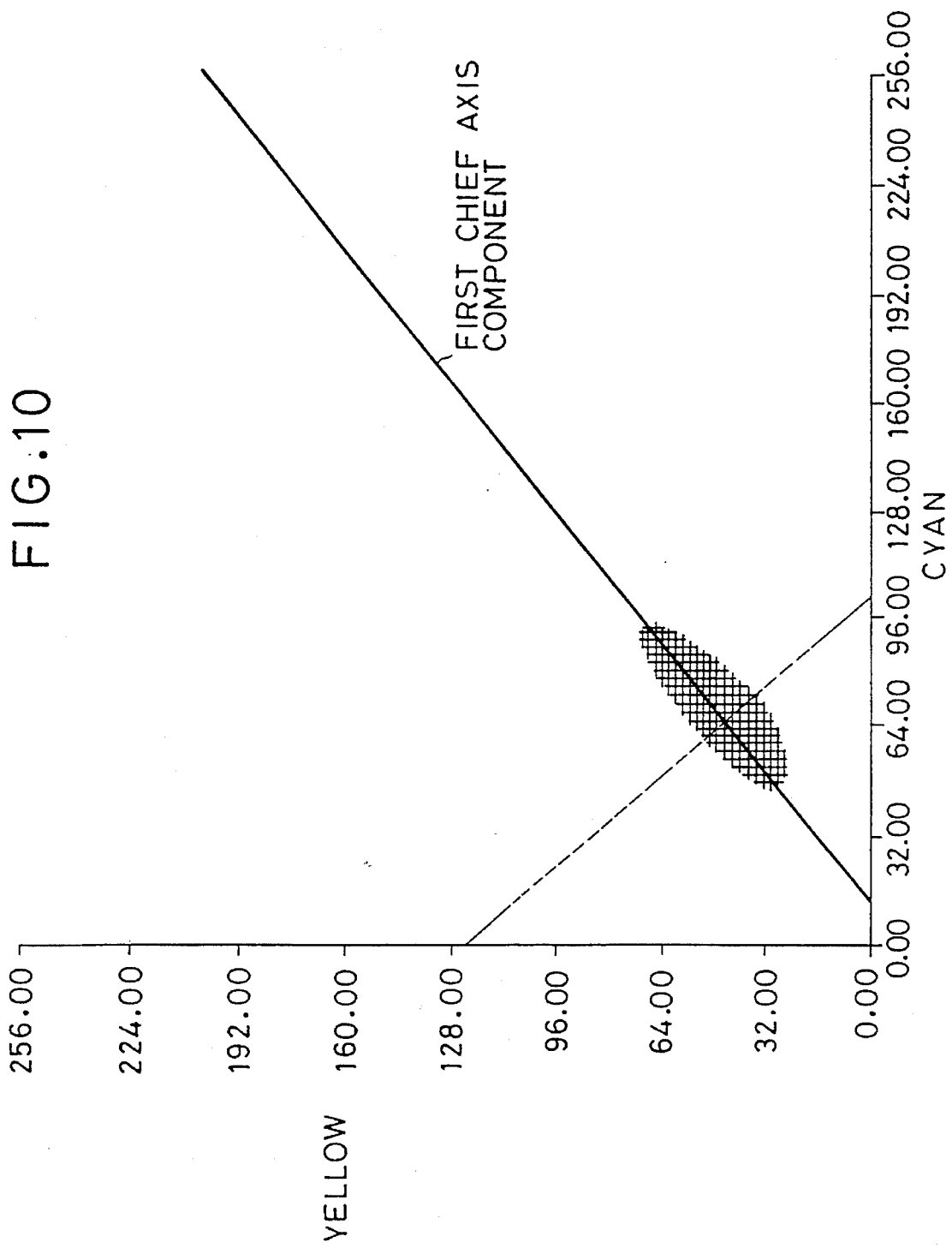
FIG. 10 is a diagram illustrating a first principle component axis of said distribution of FIG. 9.

Herein, although in the above embodiment the mask was prepared with respect to the Y, M, C picture element data, Y, H, C each color after the Y, H, C data is converted to luminace Y, chromaticity I, Q data for example may estimated. In the case where a distribution in the YMC space is formed as illustrated in FIG. 8(A) for example, with insufficient inter-cluster dispersion and with no obvious valley (bottom thereof) appearing on the frequency on each color axis, it is unlikely to estimate a correct threshold. Against this, provided with execution of a certain kind of coordinate transformation an obvious valley (bottom thereof) appears on the distribution frequency, a correct threshold can be estimated. Herein, for techniques of such coordinate transformation, any coordinate transformation will do without limitation to the aforementioned luminace Y, chromaticity I, Q transformation insomuch as any valley (bottom thereof) could be formed for estimation of a correct threshold.

Further, although in the above embodiment the Y, M, C picture element data was processed as it is, such processing is not limited thereto. For example, RGB picture element data may be useable instead of the YMC picture element data because RGB and YMC can be regarded as satisfying a complementary relationship therebetween (substantially equivalent). Further, color image data is not limited to those for printing.

In what follows, a preferred embodiment of the third and fourth inventions will be described in detail.

Figure 11:
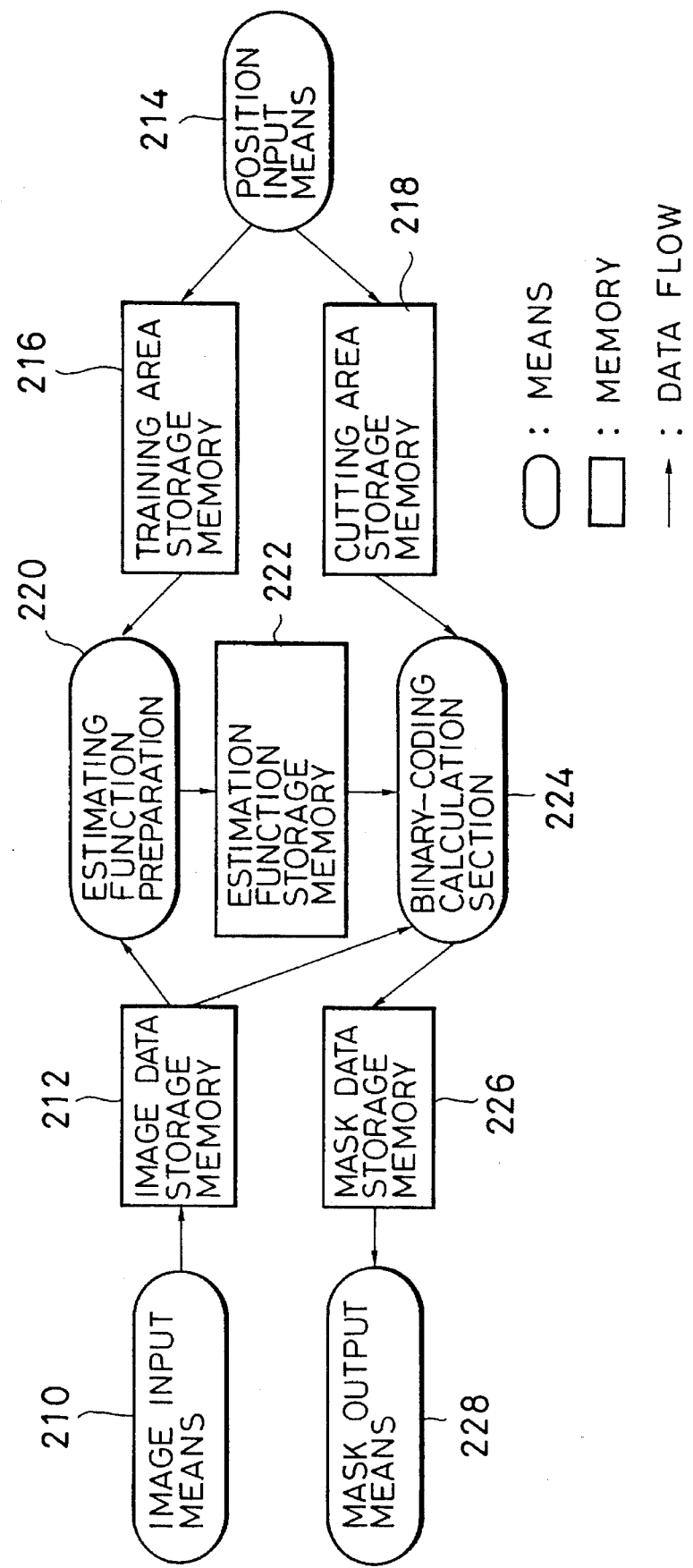
FIG. 11 is a block diagram illustrating the whole arrangement of a cut mask preparation system according to preferred embodiments of the third and fourth inventions.

Referring to FIG. 11, the system arrangement of a cutting apparatus according to the present embodiment is illustrated.

The system comprises, as illustrated in FIG. 11, an image input section 210 for inputting image data, an image data storage memory 212 for storing therein the input image data, a position input section 214 for designating an area lying across a training area and a cutting line on the image data (cutting area), a training area storage memory 216 and a cutting area storage memory 218 for storing therein respective positions of the input training area and cutting area, an estimating function preparation section 220 for preparing the estimating function $f(\mathscr{Y})$ of the foregoing equation (23) on the basis of the stored image data and training area, an estimating function storage memory 222 for storing the prepared estimating function, a binary-coding calculation section 224 for substituting, with respect to each picture element in an area designated by the cutting area in the stored image data, data of the picture element for the estimating function f $\not\!Y$) to prepare binary mask data by making the mask data ON for a picture element decided as being included in the background region and otherwise making the same OFF on the basis of a threshold do, a mask data storage memory 226 for storing the prepared mask data, and a mask data output section 228 for outputting the stored mask data for cutting the image data.

Figure 12:
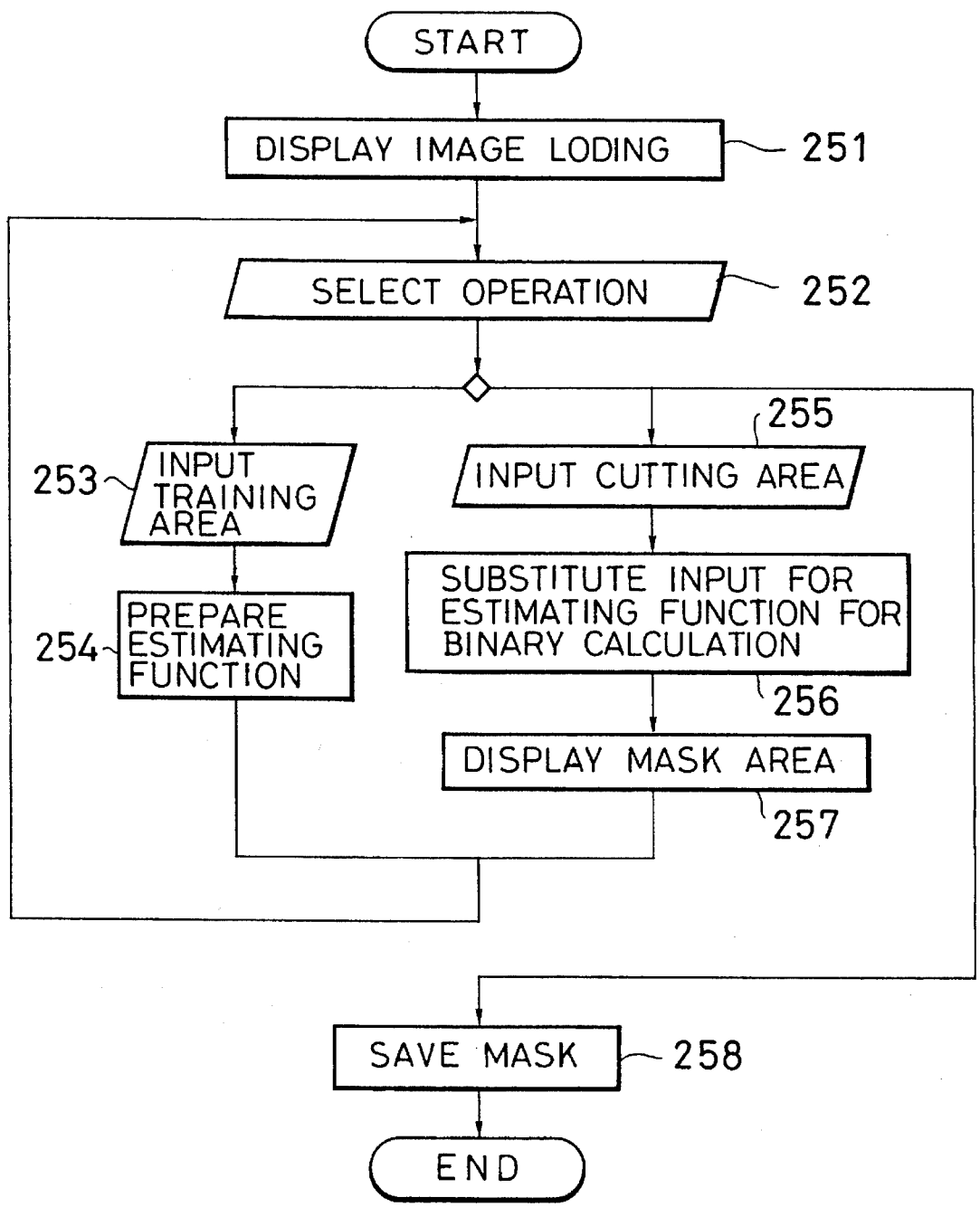
FIG. 12 is a flowchart illustrating a cut mask preparation procedure for describing operations of said preferred embodiments.

The present embodiment prepares the mask data with the aforementioned arrangement following the procedure shown in FIG. 12.

More specifically, in step 251, the image data is input through the image input section 210, and is stored in the storage memory 212 or displayed on display means (not shown).

Then, in step 252, there is selected an operation of whether a position inputted through the position input section 214 belongs to the training area or the cutting area. But, in the initial stage of the above procedure the training area can merely be input because the estimating function f $\not\!Y$) should previously be prepared. Additionally, once the input of the training area is selected successively, and the training area can be altered during the process of advancing the cutting operation.

Then, in step 253, the training area is input. Herein, for the inputting operation, training areas at one or a plurality of locations such as those including only a background region of image data may be input.

Then, in step 254, the estimating function f $\not\!Y$) is prepared using the foregoing equation (23). The preparation of the estimating function f $\not\!Y$) is achieved by estimating with respect to picture elements of the input training area the average $\not\!y$ and a codispersion matrix Cov, etc., of color data (element) $\not\!Y$ of those picture elements, and substituting them for the equation (23). For the color space at this time, spaces such as (C, M, Y), (C, Y, M, K) and (luminace Y, chromaticities I, Q), etc., are useable in addition to (red (R), green (G), blue (B)). Additionally, in the case where a plurality of the training areas are designated in the preceding step 253, estimating functions f $\not\!Y$) are prepared corresponding to the respective training areas by the number of those training areas.

Then, in step 255 the cutting area is input. In step 256, mask data is prepared on the basis of the image data in cutting area. In this case, each picture element data designated $\not\!y$ in the cutting area is substituted for the estimating function f $\not\!Y$) prepared for each training area. Thereafter, the threshold d0 is compared with the estimating function for which the image data $\not\!y$ is substituted. Given a plurality of the estimating functions, comparison is made for those estimating functions. Provided at least one among the values of the estimating function has a threshold d0 or less, a corresponding picture element is decided as belonging to the background region to make ON the mask data of this picture element, and provided all values of the estimating functions exceed the threshold d0, a corresponding picture element is decided as belonging to the real region to make OFF the mask data of that picture element. Additionally, the mask data is made ON with respect to the outside of the background region and smeared out to prepare binary mask data. Completed mask data is stored in the storage memory 226.

Then, in step 257, the mask data is displayed on display means (not shown). In step 258, if the displayed mask data is inadequate, then the operation again returns the preceding step 252 to continue the processing, while if it is adequate, then it is stored as mask data.

Thus, the adequate mask data can be prepared, and on the basis of the mask data a background region can be cut from the image data with high accuracy. In this occasion, even though any color other than colors in the training area appears in the vicinity of the contour line, an accurate cutting line can be prepared because the equation (23) extends the Mahalanobis Distance. Additionally, since in the formula (23) allowable limitation is provided on the magnification power r0, any color very different from the colors in the training area is unlikely to be decided as belonging to any background color and highly accurate mask data can be prepared.

Herein, the foregoing cutting area lies across both background region and real region, and, hence, mask data can be prepared in the case where designation of the cutting area includes the training area or does not include or in both cases.

Although in the preferred embodiment of the third and forth inventions, the automatic cutting processing was described, manual cutting may be combined therewith.

In what follows, a preferred embodiment of the fifth and sixth inventions will be described in detail.

Figure 13:
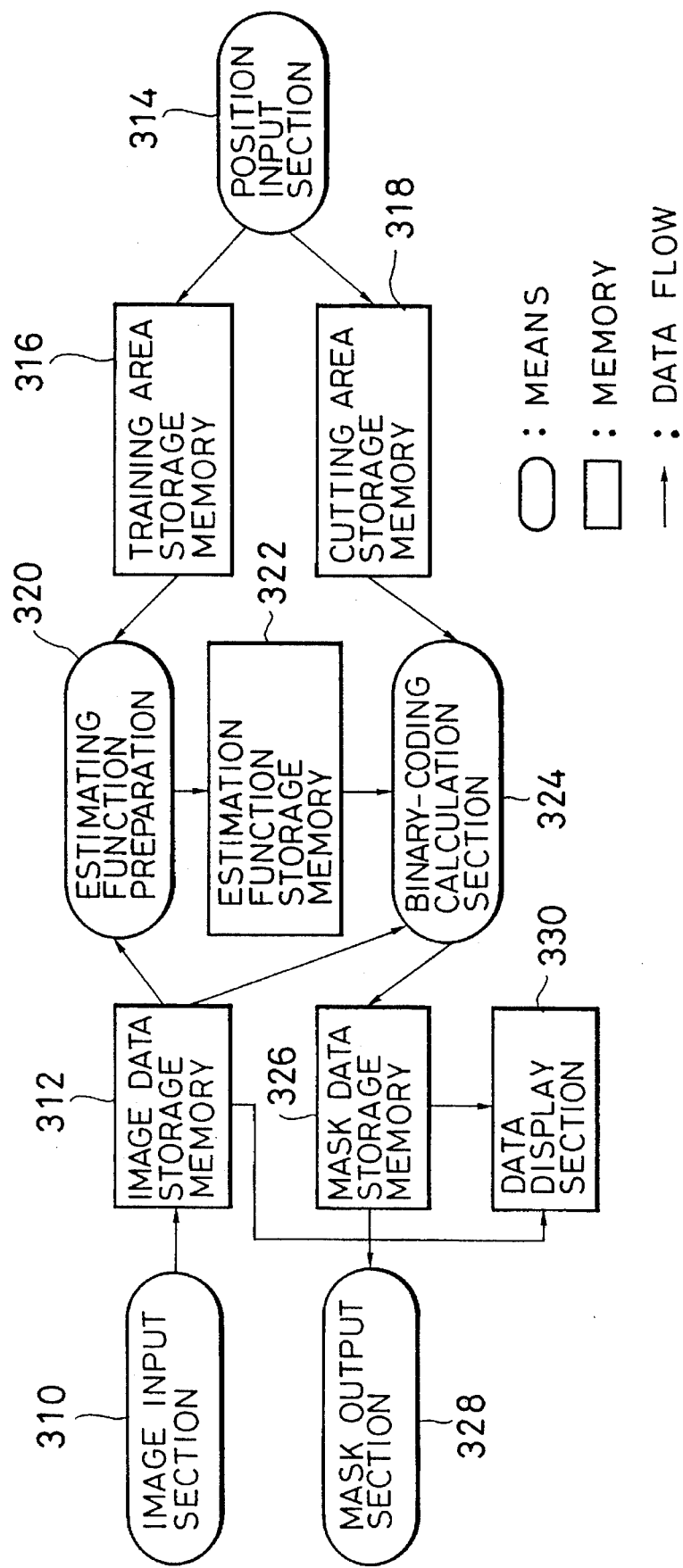
FIG. 13 is a block diagram illustrating the whole arrangement of a cut mask preparation system associated with preferred embodiments of the fifth and sixth inventions.

Referring to FIG. 13, the system arrangement of a cutting apparatus associated with the embodiment will be described.

The system comprises, as illustrated in FIG. 13, an image input section 310 for inputting image data thereinto, image data storage memory 312 for storing the input image data, a position input section 314 for designating areas lying across a training area or a cutting line (cutting area) on the image data, a training area storage memory 316 and a cutting area storage memory 318 each for storing position data in the input training area and in the cutting area, an estimating function preparation section 320 for preparing an estimating function f $\not\!Y$) using the Mahalanobis Distance of a later-described equation (31) for example on the basis of the foregoing stored image data and the training area, an estimating function storage memory 322 for storing therein the prepared estimating function, a binary-coding calculation section 224 for preparing binary mask data by substituting, with respect to respective picture elements in an area designated as the cutting area, said picture element data, e.g., density data for the estimating function f $\not\!Y$), and making ON mask data with respect to picture elements decided as belonging to the background region and otherwise making OFF the same, a mask data storage memory 226 for storing therein the prepared mask data, a mask data output section 228 for outputting the stored mask data for cutting of the image data, and a data display section 230 for displaying the input image data and the prepared mask data on a screen thereof.

Operation of the embodiment arranged as such is as follows.

Figure 14:
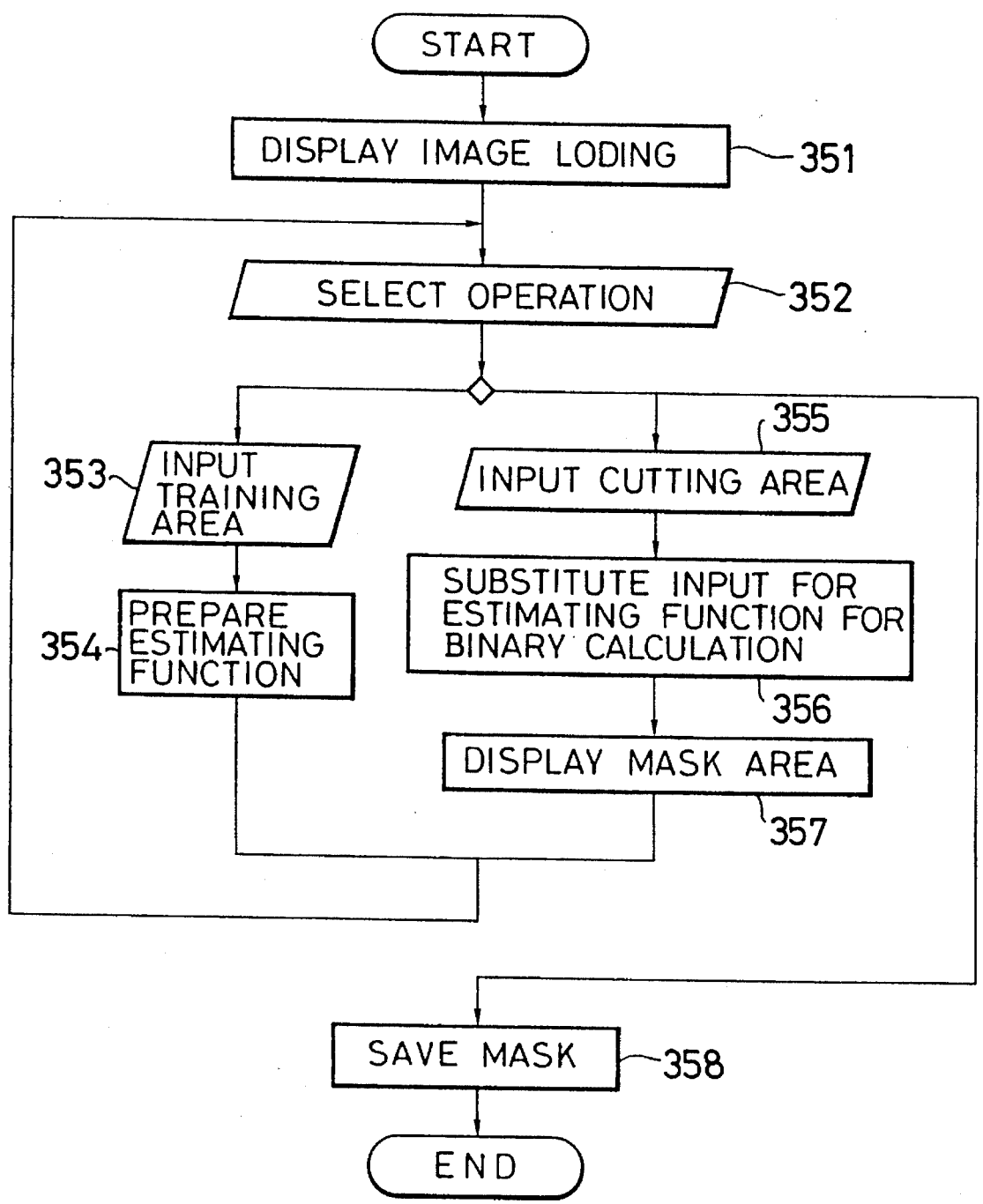
FIG. 14 is a flowchart illustrating a cut mask preparation procedure for describing operations of said preferred embodiments.

In a cutting mask preparation apparatus associated with the embodiment of the fifth and sixth inventions the mask data is prepared following a procedure illustrated in FIG. 14. Herein, although the just-mentioned procedure is basically the same as the procedure of FIG. 12 being the embodiment of the third and fourth inventions, its details are slightly different from the latter and hence it will be described in , order.

First in step 351, image data is input through the image input section 310, and is stored in the storage memory 312 and/or displayed on the data display section 330.

Then, in step 352, there is selected an operation setting whether a position inputted through the position input section 314 should belong to the training area or the cutting area. Herein, it should be noticed that in the initial stage of this procedure the estimating function f($y$) must be prepared and, hence, only the input into the training area is possible. Additionally, once the input into the training area is selected, the cutting area can be successively selected, and the training area can be altered in the course of advancing the cutting process.

Then, in step 353, the training area is input. For this input, one or more areas as part of the background region in the image data and one or more areas as part of the real region in the same are input as the training area. Additionally, measures are previously taken for an input method which assures discrimination of whether the inputted training area belongs to the background region side or to the real region side.

Then, in step 354, there is prepared the estimating function f($y$) deciding on the basis of image data of the training area whether picture elements in the cutting area belong to the real region or the background region. The estimating function f($y$) is prepared for each training area corresponding to each training area designated in the preceding step 353. For the estimating function a Mahalanobis Distance expressed by the following equation (31) for example is useable.

$$f(y)^2 = (y_{-z,2})^t \text{Cov}^{-1} (y_{-z,2}) \quad (31)$$

Herein, $y$ is the average (vector) of density $y$ in the training area and Cov is a codispersion matrix. Further, f($y$) always takes non-negative real numbers and indicates that it approaches a color distribution in the training area as its values are decreased.

Then, in step 355, an area including a contour between the real region and the background region is designated as the cutting area, and input.

Then, in step 356, mask data is prepared from the picture element data in the cutting area. First, each picture element data $y$ in the cutting area is substituted for the estimating function f($y$) of the equation (31) prepared for each training area. Therefore, an estimating function is selected which has a minimum estimating function valve among those of the estimating functions for which the picture element data has been substituted. The selected estimating function is decided on from which training area it has been prepared. Hereby, there is found a training area having colors closest to those of the picture element data $y$. If the estimating function is prepared from a training area on the background region, then the associated picture element is decided as belonging to the background region and makes the mask data ON, while if it is prepared from a training area on the real region, then the associated picture element is decided as belonging to the real region and makes the mask data OFF.

In step 357, the mask data is displayed on the screen of the data display section 320. In step 358, if the displayed mask is inadequate, then the operation returns again to the previous step 352 to continue the processing, and if it is adequate, then it is stored as the mask data. Further, the stored mask data is output through the mask output section.

As described above, adequate mask data can be prepared, whereby the background region can be cut accurately from the original image data without producing a contour line with any narrowed color on the background region side being left behind on the contour of the real region.

Although in the embodiment of the fifth and sixth inventions there were designated a plurality of the training areas belonging to the real region and those belonging to the background region, the present inventions are not limited thereto. For example, training areas in the real region and in the background region may be designated by at least one from each region.

In what follows, a preferred embodiment of the seventh and eighth inventions will be described in detail.

Figure 15:
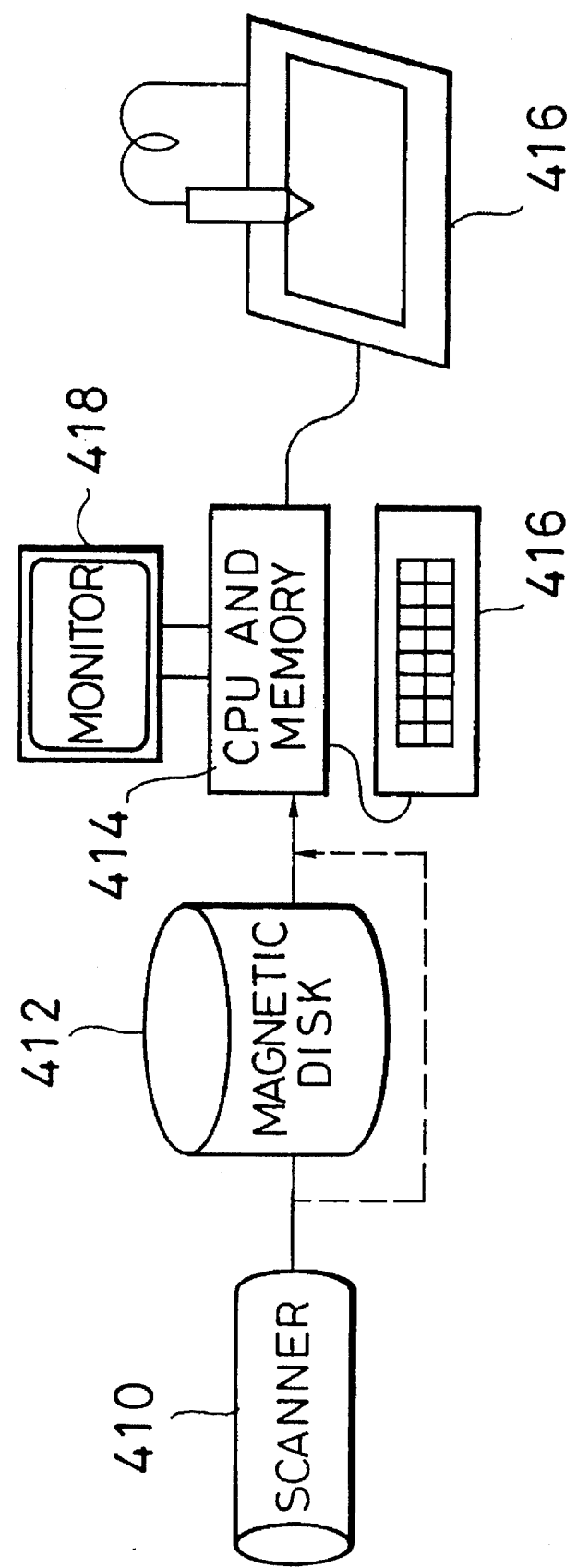
FIG. 15 is a front view partly including a perspective view, illustrating the arrangement of a cutting apparatus associated with the preferred embodiments of the seventh and eighth inventions.
Figure 16:
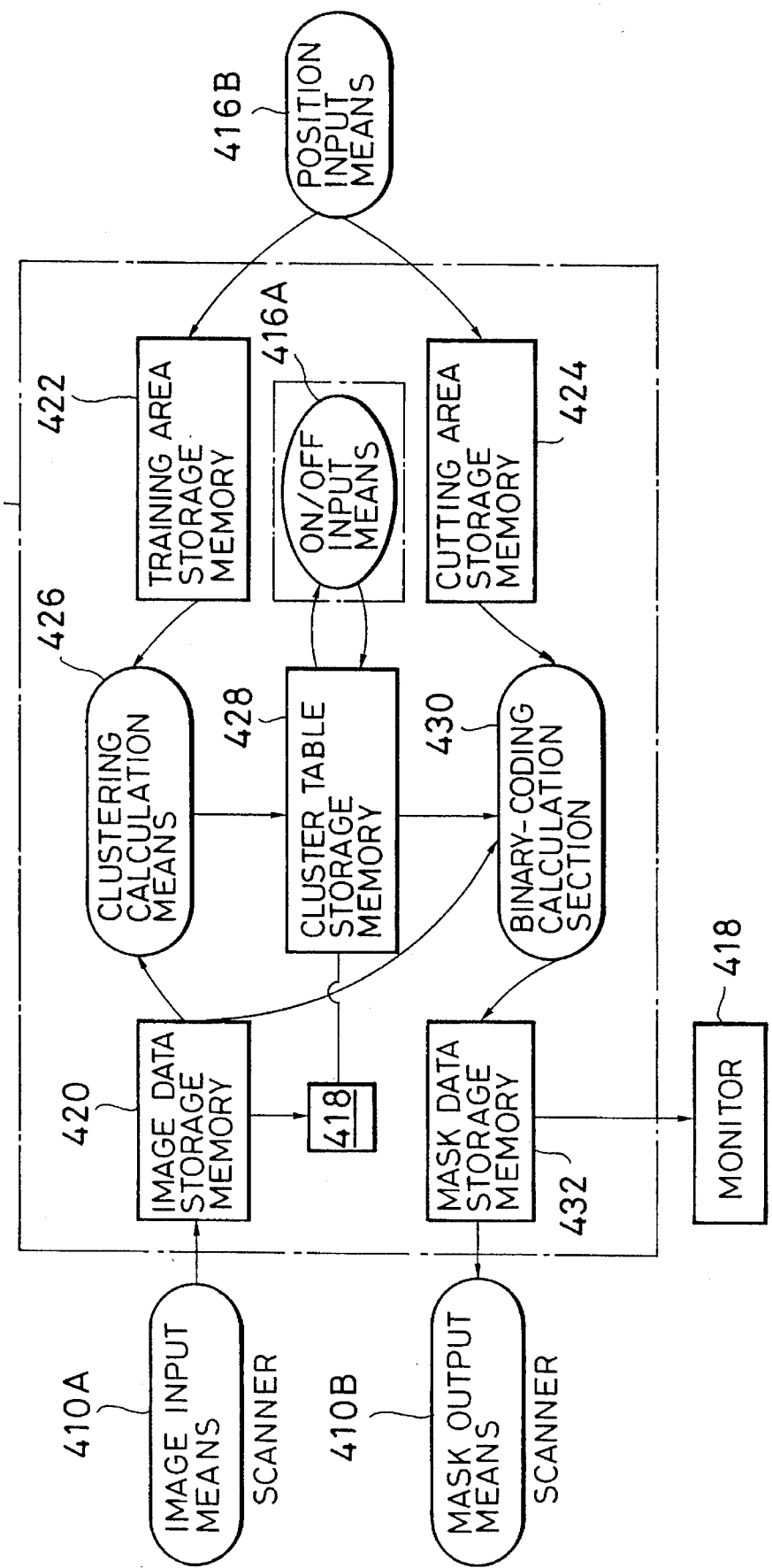
FIG. 16 is a block diagram illustrating the conceptual arrangement of said apparatus.

The present embodiment provides a cut mask preparation apparatus arranged as illustrated in FIG. 15. Referring to FIG. 16, a conceptual functional view of the cut mask preparation apparatus is illustrated.

The cut mask preparation apparatus comprises, as illustrated in FIGS. 15 and 16, a scanner 410 serving as image input means 410A for inputting primary (Y, M, C) image data from a color transparent document and as mask output means 410B for outputting the image data after being processed onto a film, a magnetic disk 412 for storing the input image or the output image, a central processing unit (CPU)/memory section 414 for processing the input image in conformity with the present invention to divide the same into a background region or a real region and preparing mask data in the background region, a keyboard or a digitizer 416 serving as ON/OFF input means 416A for inputting ON/OFF information for use in clustering into the CPU/memory section 414 and as means 416B for inputting position information of the training area or the cutting area, and a display section (monitor) 418 for displaying on its screen the image data being processed, the mask data after processing or a representative color of each cluster.

The CPU/memory section 414 comprises, as illustrated in FIG. 16, an image data storage memory 420 for storing the input image data, a training area storage memory 422 for storing therein the position information of the training area input through the keyboard or the digitizer 416, a cutting area storage memory 424 for storing the position information of the cutting area input through the keyboard or the digitizer 416, clustering calculation means 426 for clustering the image data in the training area among the image data in the image data storage memory 420 and calculating a cluster table listing thereon the number of clusters and information of each cluster, a cluster table storage memory 428 for storing the calculated cluster table, binary-coding calculation means 430 for performing binary-coding calculation for the image data in the cutting area among those in the image data storage memory 420 on the basis of the cluster table storage memory to prepare the mask data, and a mask data storage memory 432 for storing the prepared mask data.

For the keyboard or digitizer 416, either of them may serve also as the ON/OFF input means 416A and the position input means 416B and each of them may be any of the ON/OFF input means 416A and the position input means 416B.

The embodiment of the seventh and eighth inventions arranged as described above operators as follows.

Figure 17:
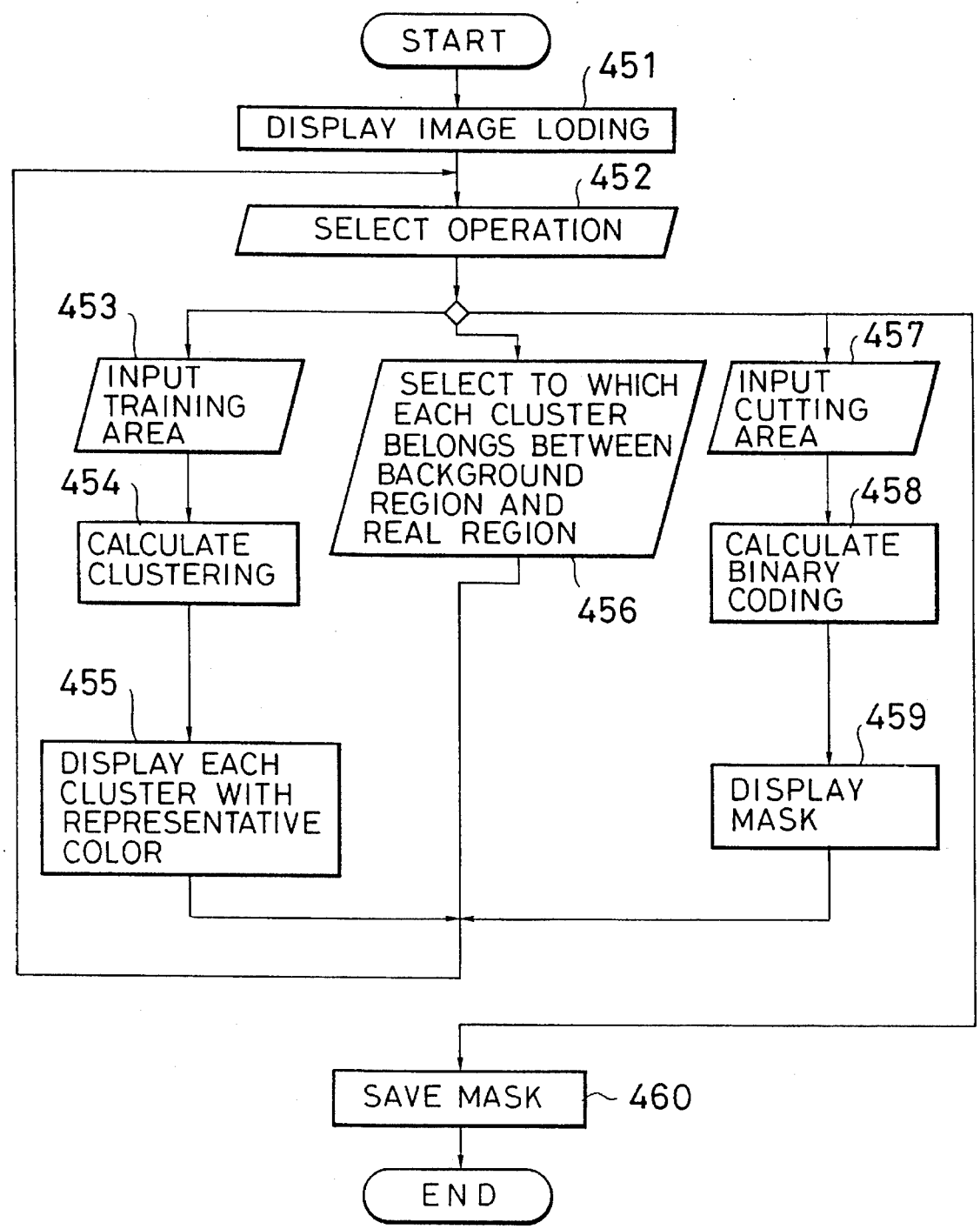
FIG. 17 is a flowchart illustrating a mask data preparation procedure in said preferred embodiment.

The cut mask preparation apparatus of the present embodiment executes a cut mask preparation processing following the procedure illustrated in FIG. 17.

With the start of the procedure, in step 451, the image data read through the scanner 410 or previously recorded on the magnetic disk 412 is input (located) into the CPU/memory section 414 and displayed on the display section 418.

Then, in step 452, operation of the keyboard or the digitizer 416 is selected on whether it is one of inputting position designation of the training area or the cutting area or one of selecting the cluster into the background region or the real region. However, in the initial stage of the procedure the operation can advance only to step 453 because the training area must first be designated. After the training area is designated and processing in steps 454 and 455 is completed, unless the operation advances to step 456 at least once to select associated clusters, it can not advance to step 457 for the position designation of the cutting area. Additionally, in this procedure, alteration of the cluster selection or alteration of the training area designation is allowable in the course of advancing the processing.

Figure 18:
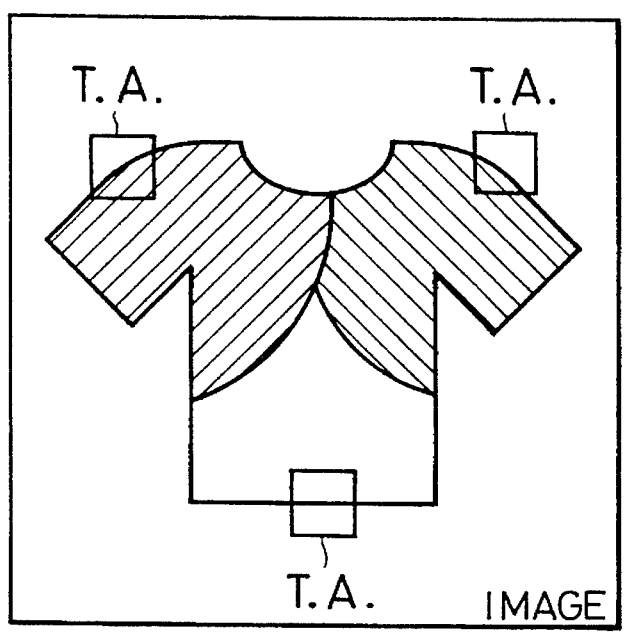
FIG. 18 is a plan view illustrating the designation of a training area in an image.

In step 453, the position designation of the training area is input through the position input means 416A. For the training area, there are designated one or a plurality of positions lying across the background region and the real region in the image as indicated by a symbol T. A. in FIG. 18 for example.

Then, in step 454, the input one or plurality positions of the training area are regarded as one area, and clustered on a parameter space (a color space formed on Y, M, C axes in the present embodiment). The clustering is achieved with the procedure shown by the flowchart of FIG. 19, and a cluster table is output as the result. The procedure of FIG. 19 will be described later in detail.

In the cluster table there are stored the number of clusters and information of each cluster. Each cluster information includes the average of data belonging to the cluster (vector, codispersion matrix, data number (pixel number), and flags indicating whether the cluster belongs to either the background regions or the real region (flag="1" indicates the cluster belonging to the background region for example and otherwise flag="0"). However, the flag is not determined in the step 454 and is determined by an operator in step 456 described later.

In the process of the clustering, a labelled image is tentatively used in the clustering calculation means 426. The labelled image is a memory region for storing therein the number of each cluster correspondingly to the picture element data for the purpose of indicating to which cluster the picture element data in the training area belongs. Decided the picture element data as belonging to a certain cluster, the number of that cluster is regarded as a labelled image of that picture element data.

Figure 19A:
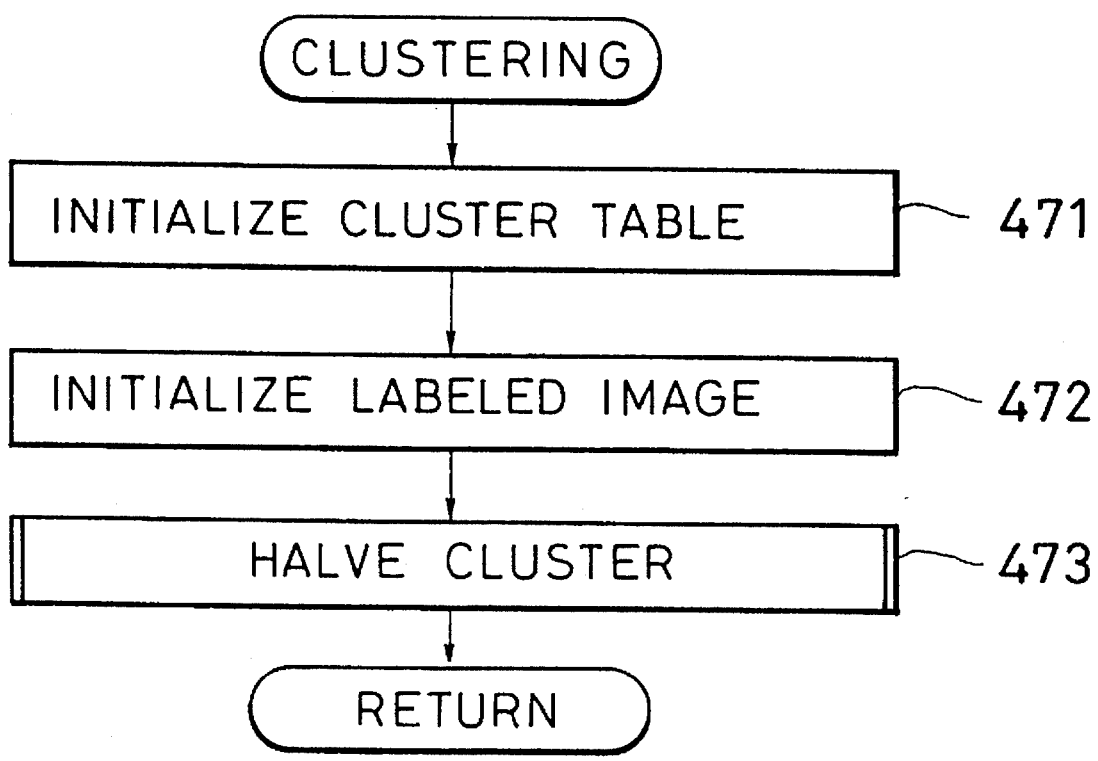
FIGS. 19(A) and (B) are flowcharts each illustrating a detailed processing procedure of clustering.

In the following, a detailed procedure of the clustering calculation processing will be described with respect to the picture element data in the training area with reference to FIG. 19. FIG. 19(A) illustrates a main routine for the clustering, and FIG. 19(B) illustrates a routine for halving the cluster in the main routine.

For the clustering, as illustrated in FIG. 19(A), in step 471, the whole picture element data belonging to the training area is regarded as one initial cluster, and the average of the data and a codispersion matrix of the same are calculated to fill the cluster table therewith. Thus, the cluster table is initialized. Herein, the number of the initial cluster is set to 1.

Then, in step 472, the labelled image is completely filled with the number of the initial cluster (1 for example) for initialization.

Figure 19B:
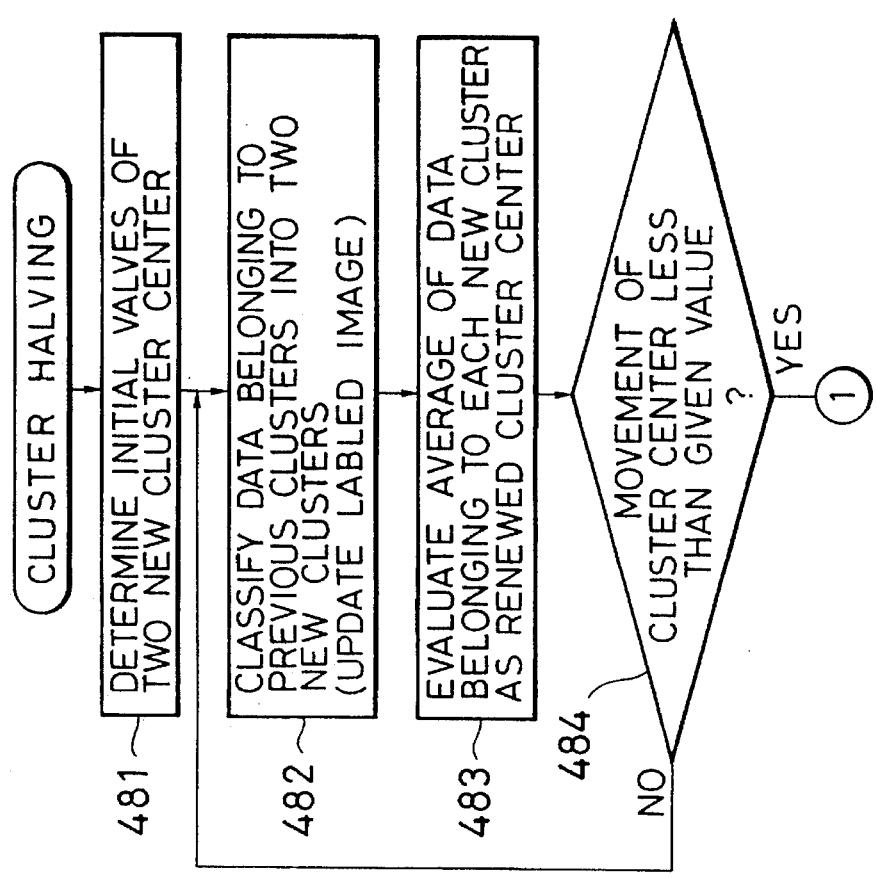

Then, in step 473, there is called the routine for halving the original cluster shown in FIG. 19(B) (cluster halving routine). Herein, the cluster halving routine is one of the type in which the routine itself is recursively called, so that the initial cluster is divided to two or more clusters when it returns from the halving routine to the main routine.

Figure 20:
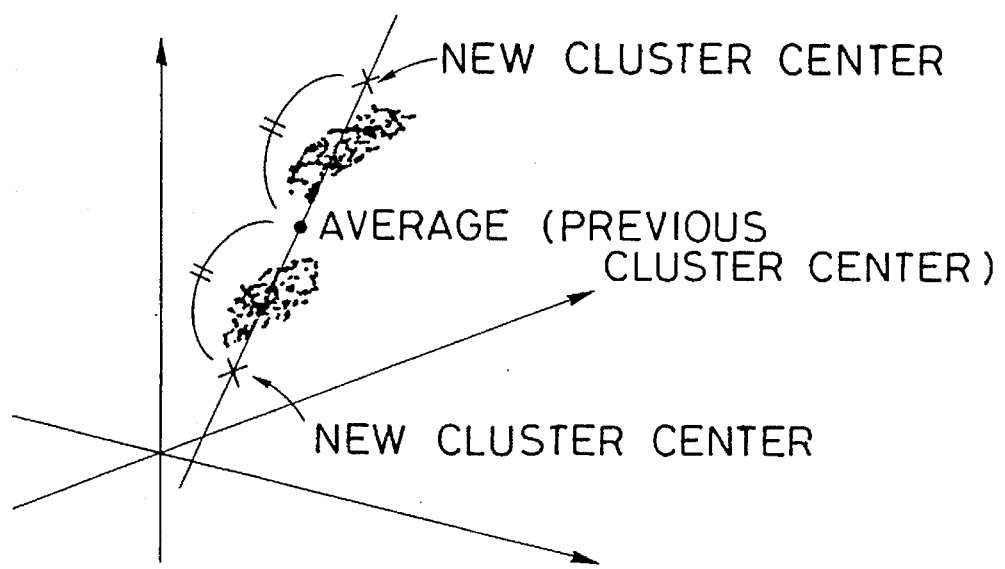
FIG. 20 is a diagram exemplarily illustrating how to estimate a cluster center.

When this routine is called, in step 481, there is determined an initial value of a cluster center of two new clusters yielded by the halving. The center of two new clusters are adequally taken such that it lies, as illustrated in FIG. 20 for example, on the first primary component axis of the initial (old) cluster and that the average of the two centers is coincident with the average (center) of the old cluster. Further, the first primary component axis is a straight line which passes through the average i.e., center of the old cluster on the color space and has its directional vector which is to be an eigen vector corresponding to the maximum eigen value of the codispersion matrix, and is calculated on the basis of the cluster table of the old cluster.

Then, in step 482, respective picture element data which belonged to the old cluster is classified into two new clusters, and a labelled image is updated such that it is classified from 1 to 1 and 2, for example. In this classification, an equation calculating a certain kind of distance from respect each picture element data to each cluster is used to classify (label) the picture element data to a cluster which has the minimum distance.

For the calculation of the distance d between the data and the cluster, the following methods (i) through (iv) and other methods are useable.

(i) An Euclidean space calculated by the following equation (41) on the parameter space is used as the foregoing distance d.

$$d(x, k)^2 = \sum_{i=1}^{N} (x_i - Ck_i)^2 \quad (41)$$

Herein, N; dimension of the parameter space
k; cluster number
$X = (X_i)_{i=1}^{N}$; data
$Ck = (Ck_i)_{i=1}^{N}$; central (average) of k-th cluster.

Use of the Euclidean Distance is equivalent to the midperpendicular surface between the new two cluster centers taken as a boundary surface.

(ii) A Mahalonobis Distance is used as the foregoing distance according to the following equation (42).

$$d(x, k)^2 = \sum_{i=1}^{N} \sum_{j=1}^{N} (x_i - Ck_i) \cdot Cov_k^{-1}(i, j) \cdot (x_j - Ck_j) \quad (42)$$

Herein, $Cov_k^{-1}$ (i, j); (i,j) component of the inverse matrix of the covariance matrix of a k-th cluster. The covariance matrix Cov is not determined in the first loop and, hence, is used from the second loop.

(iii) The total sum of distance in the respective directions is used according to the following equation (43) as the foregoing distance d.

$$d(x, k) = \sum_{i=1}^{N} |x_i - Ck_i| \quad (43)$$

(iv) The maximum value among distances in the respective directions is used according to the following equation (44) as the foregoing distance d.

$$d(x, k) = \max \{x_i - Ck_i\} \quad (44)$$

Then, in step 483, the position of the center of each new cluster is updated. The updating is achieved by using the average of the picture element data classified to each new cluster as a new center of that cluster.

Then, in step 484, a termination decision is executed on whether the clustering processing should be repeated or not. Herein, the amount of the shift of the cluster center updated in the previous step 483 is compared to the cluster center (tentative center) before being updated is calculated, and if it is greater than a given value, then the processing is decided as being repeated, and the operation returns to step 452 for repeating the clustering. Alternatively, if it is less than the given value, then the repeated clustering is decided to be terminated, and the operation advances to step 485.

In step 485, the cluster table is updated. The updating is achieved by incrementing the cluster number by 1, substituting the information of the old cluster for the information of one of the new clusters, and writing the information of the other new cluster in a column of cluster information added anew.

Then, in step 486, the one new cluster is decided on whether it satisfies clustering termination condition. The termination condition is given in a case, for example, where a relation det (Cov)<S is satisfied under S and T assumed constants and, hence, spreading in the cluster is small or where a relation (the number of data in the cluster)<T is satisfied and, hence, the number of data is small.

If the termination condition is not satisfied as the result of the decision, then the operation advances to step 487 and the new cluster is decided as being yet larger to permit further clustering, and the cluster halving routine is recursively-called for further clustering.

On the other hand, if the termination condition is satisfied, then the operation advances to step 488, and the clustering termination condition is decided with respect to the other new cluster in the same manner as in the step 486. If the termination condition is not satisfied, then the operation advances to step 489 where the cluster halving routine is recursively-called as in the step 487, for further clustering. If the clustering termination condition is satisfied, then the operation returns to the clustering main routine as illustrated in FIG. 19(A).

The clustering is terminated as described above. Thereafter, the operation advances to step 455 of FIG. 17.

In the step 455 of FIG. 17, each divided cluster is displayed on the display section 418 with a representative color. For the representative color, a color of the cluster center (average) is used.

After the step 455 is terminated, the operation returns to the step 452 and then advances to step 456. In the step 456, the representative color of each cluster displayed on the display section 418 and the original image are compared with the eye to indicate the representative color to be decided by the ON/OFF input means 416 A on to which it belongs between the background region and the real region, so that each cluster is specified as to which it belongs between the background region and the real region and, hence, the flag in the cluster table is determined.

Then, in step 457, the cutting area is inputted. Further, in step 458, the cluster table is used to binary the cutting area for preparation of the mask data.

More specifically, for each picture element in the cutting area, a distance between the associated picture element color (picture element data) and each cluster center is calculated using the foregoing equations (41) through (44) (equivalent to the estimating function) to select a cluster where the distance is minimum, for decision on whether the cluster belongs to the background region or the real region. If the cluster belongs to the background region, then the mask data for the picture element concerned is made ON while if it belongs to the real region, then the mask data is made OFF. Herein, for the calculation of the distance d, the same equation as used in the step 482 may not necessary be used. Namely, the ON-OFF calculation for a picture element mask may include the use of different or same estimating equations or those other than estimating equations (41) through (44).

Then, in step 459 shown in FIG. 17, the prepared mask data is displayed, and in step 460 the mask data is stored in the storage memory 432.

Now, for a procedure to cut one image, it can be considered that a training area is first input, then ON/OFF of each cluster is input, and a cutting area is successively input along the contour line thereof, to prepare a mask. In this situation, various colors may appear until the operation goes around the circumference of the object image to be cut. Thereupon, a situation may be imagined that any color belonging to a background region at a certain position belongs to a real region at another portion. For dealing with such a situation, the ON/OFF of each cluster can be altered when each cutting area is input.

Upon the cutting area being successively input, the ON/OFF of a mask of each pixel in an overlapping portion may be determined such that those calculated last take precedence as a principle as illustrated in Table 1 for example. In a case where no desired contour line is yielded, the situation can be modified by designating anew a cutting area after altering the ON/OFF of the cluster. Herein, such a rule of the determination at an overlapping portion may be changed to an OR rule as listed in Table 2 and an AND rule as listed in Table 3, etc., for example if necessary. In Tables 1 through 3, x are values of masks already written, y values of masks calculated anew, and z values of masks written anew,

TABLE 1

Last Precedence Rule

| x | y | z |
|---|---|---|
| on | on | on |
| on | off | off |
| off | on | on |
| off | off | off |

TABLE 2

OR Rule

| x | y | z |
|---|---|---|
| on | on | on |
| on | off | on |
| off | on | on |
| off | off | off |

TABLE 3

AND Rule

| x | y | z |
|---|---|---|
| on | on | on |
| on | off | off |
| of | on | off |
| off | off | off |

Additionally, in a case where no desired mask is yielded by the alteration of the ON/OFF of a cluster, a training area may be designated anew. For example, re-designation of a training area in the vicinity of a cutting area assures improved quality.

For portions unlikely to be cut even with use of the above procedure, e.g., an extreme highlight or shadow portion and the like including portions where no contour line is existent, manually written modification may be available. For techniques of such modification, there is considered a technique where a position to be modified is designated through position input means such as a keyboard digitizer and a mouth, etc., and an area of a certain size around that position as smeared as the mask-ON, including a technique where an area likewise designated is erased as the mask-OFF, a technique where two positions are designated and connected by a line of the mask-ON, and so on. A mask can be prepared using any of the above techniques.

With the completion of the above processing, one surrounded with masks circumferentially of a pattern of the object to be cut is formed. A non-processed portion outside the masked area can be filled with a smearing processing which fills that portion with masks.

Additionally, for notches of a contour line, a smoothing processing may be available, if necessary.

For output of the mask data, there are considered techniques such as a technique where mask data is transferred to a page-making-up device for collection thereof together with other picture patterns, a technique where mask data is transferred to a scanner and exposed onto a film to yield a mask plate, a technique where contour line data is converted to vector data and transferred to a cutting plotter in which a peel coat film is cut to obtain a mask plate, and the like.

Although in the embodiment of the seventh and eighth inventions the C, M, Y space was exemplified as a parameter space (color space) of image data, such a space taken into consideration upon execution of the present invention is not limited thereto, and may include, besides the above space, a color space of red (R), green (G), and blue (B) and further those applied to arithmetic-operation and transformation such as a set of derivative of each color plate, coordinates of luminace Y, chromaticity I. Q, and coordinates of hue H, luminosity V, and saturation C, and the like.

Herein, provided a training area is clustered as being variable in the number of clusters, the training area can first be subjected to a processing corresponding to multiple-value-conversion of the area to representative colors in response to the number of colors constituting the image, and thereafter binaried to halve the area to a background region and a real region. Hereby, an image including a background region and a real region both comprising a plurality of colors may also be cut. In particular, an object with any shadow can be cut accurately.

Further, since the training area and the cutting area are independently provided as separate areas, the training area can be smaller. Hereby, the amount of the calculation for the clustering can be reduced, and, hence, processing time can be reduced with the associated processing being made effective.

Additionally, in the clustering, data originally in multiple-dimension can be processed as it is. Accordingly, the present embodiment assures less information loss and, hence, highly accurate cutting, compared with the technique where data is clustered as a one-dimensional distribution projected onto a certain axis on a color space.

In what follows, a preferred embodiment of the ninth invention will be described in detail.

Figure 22:
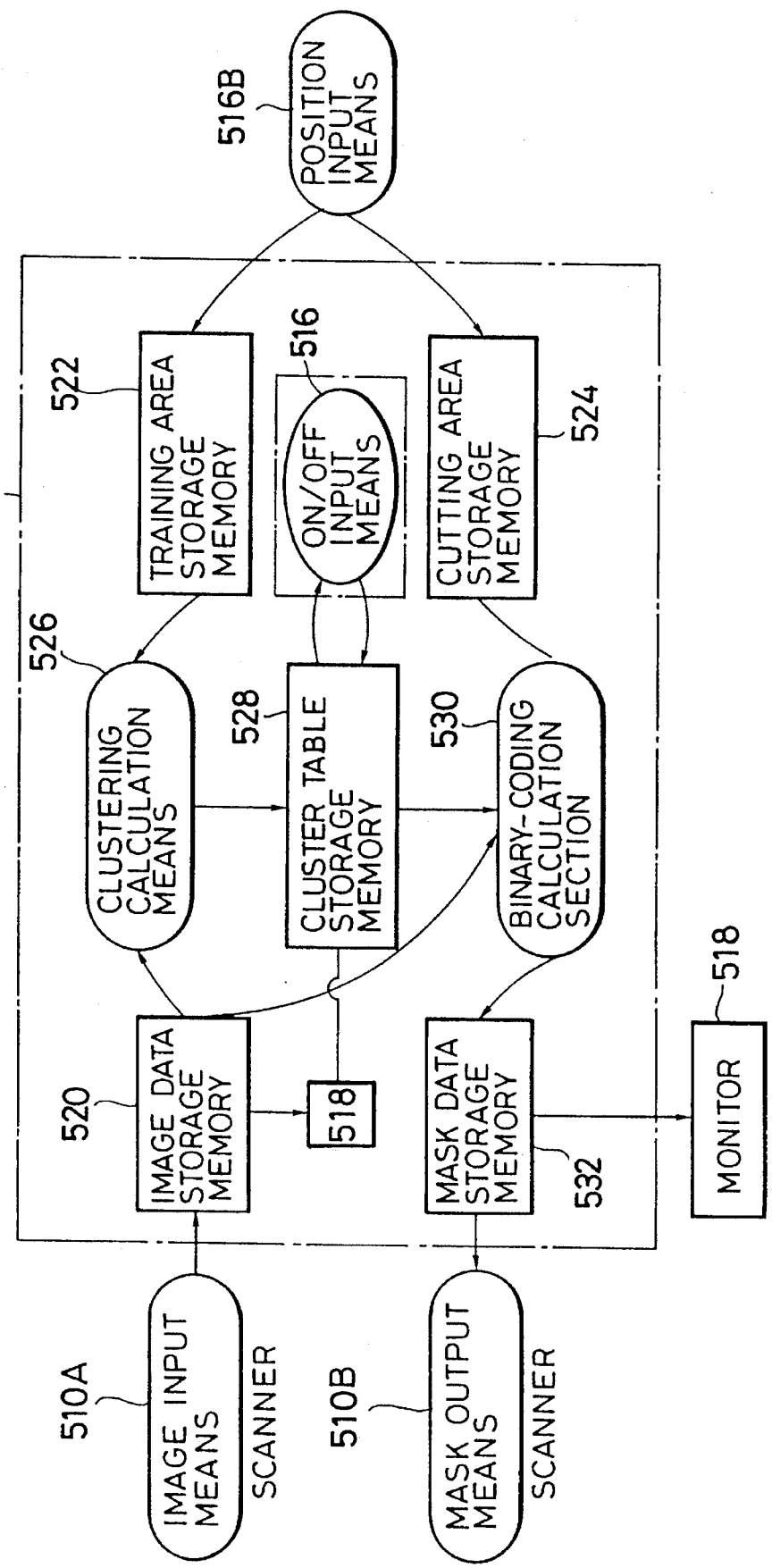
FIG. 22 is a block diagram illustrating the conceptual arrangement of said preferred embodiment apparatus.

The embodiment of the ninth invention provides a cut mask preparation apparatus arranged as illustrated in FIG. 21. Referring to FIG. 22, there is illustrated a functional conceptual view of the cut mask preparation apparatus. Although the arrangement of FIGS. 21 and 22 is the same as that of FIGS. 15 and 16 as the embodiment of the seventh and eighth inventions, details therebetween are slightly different and will hence be described in order.

As illustrated in FIGS. 21 and 22, the cutting mask preparation apparatus comprises: a scanner 510 serving as both image input means 510A for inputting image data of the three primary colors (yellow (Y), magenta (M), and cyan (C)) from a transparent color document, for example, and mask output means 510B for outputting processed mask data; a magnetic disk 512 for storing therein an input image or an output image; a central processing unit (CPU)/memory section 514 for applying to the input image data a processing according to the present invention to divide the same into a real region and a background region and preparing mask data for the background region to output the same to the magnetic disk 512 and the scanner 510; designation information input section 516 composed of a keyboard, a digitizer, a mouse, and the like, serving as both ON/OFF input means 516A for supplying to the CPU/memory section 514 ON/OFF information on to which any cluster belongs between the background region and the real region upon clustering and means 516B for supplying to the same position information of a training area or a cutting area; and a display (monitor) section 518 for displaying on its screen the processing image data, the processed mask data, or a representative color of each cluster.

The CPU/memory section 514 comprises, as illustrated in FIG. 22, image data storage memory 520 for storing input image data, a training area storage memory 522 for storing therein position information of the training area input through the designation information input section 516; a cutting area storage memory 524 for storing therein position information of the cutting area inputted through the designation information input section 516; clustering calculation means 526 for clustering the image data in the training area among those in the image data storage memory 520 and estimating by calculation a cluster table indicating information concerning each divided cluster; a cluster table storage memory 528 for storing therein the estimated cluster table; binary calculation means 530 for binary-coding-calculating the image data in the cutting area among those stored in the image data storage memory 520 based on the clusters to be included in the background region to prepare mask data; and a mask data storage memory 532 for storing therein the prepared mask data.

The designation information input section 516 may serve as both the ON/OFF input means 516A and the position input means 516B or may serve as any of them.

The embodiment of the ninth invention arranged as described above operation as follows.

Figure 23:
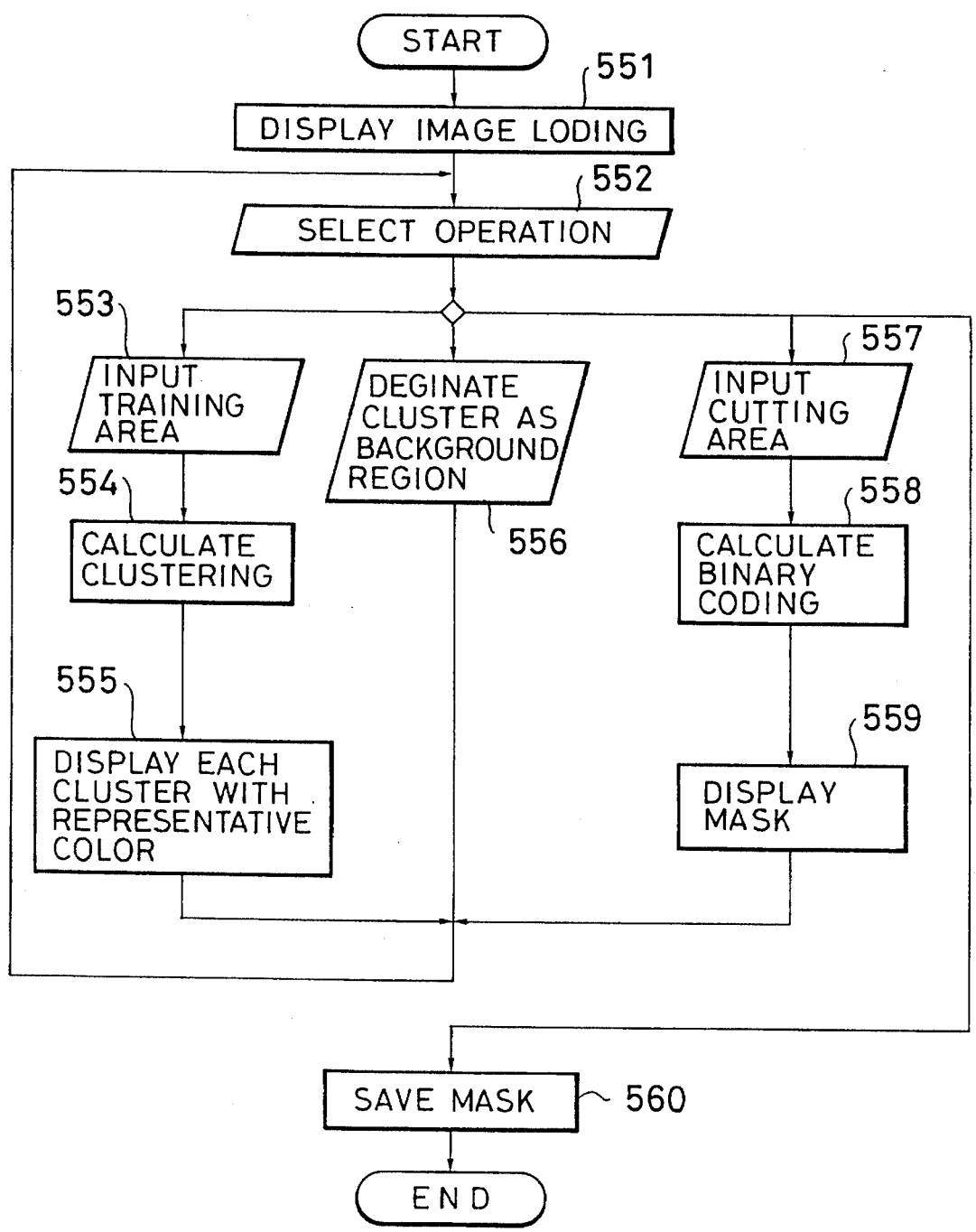
FIG. 23 is a flowchart illustrating the whole of a mask data preparation procedure for describing operation of said preferred embodiment of FIG. 21.

The cutting mask preparation apparatus of the present embodiment is to execute the preparation processing of a cutting mask in accordance with the procedure illustrated in FIG. 23. Herein, although the present procedure is basically the same as that of FIG. 17 as the embodiment of the seventh and eighth invention, details thereof are slightly different and hence will be described in order below.

With the starting of the procedure, in step 551, image data read through the scanner 510 or previously recorded on the magnetic disk 512 is input (loaded) into the CPU/memory section 14, and displayed on the display section 518.

Then, in step 552, input operation by the designation information input section 516 selects one among operations of inputting a training area position (steps 553 through 555), of designating a cluster as the background region (step 556), and of inputting a cutting area position (step 557 through 559), or storing (saving) mask data (step 560). However, when any operation has not yet been done, the operation advances to step 553 to input the training area position.

In step 553, the position of the training area is designated by operating the position input means 516B, and image data in the training area is input into the clustering calculation means 526. Then, in step 554, the clustering calculation means 526 divides the input data into clusters, and in step 555, the each divided cluster is displayed on a screen of the monitor 518 with a representative color, and the operation returns to the step 552.

In the case where cluster designation operation is selected in the step 552, the operation advances to step 556.

In step 556, each cluster displayed with the representative color is referred to, and clusters decided as belonging to the background region are designated, and the operation returns to the step 552.

In the case where cutting area designation operation is selected in the step 552, the operation advances to step 557.

The step 557 is to be executed after the processing in the steps 555 and 556 has been completed, wherein the cutting area position is inputted through the position input means 516B. In step 558, binary-coding calculation is executed with respect to the image data of the inputted cutting area depending upon whether the image data is included in the cluster designated as belonging to the background region. Then, in step 559, a mask is prepared and displayed on the screen on the basis of the binary-coded picture element data included in the background region. Thereafter, the operation returns to step 552.

In step 552 the operation is selected. The procedure advances to step 553 in the case where the clustering is again effected, and advances to step 556 in the case when the cluster designation for the background region is altered, and further advances to step 557 in the case where a mask for another cutting area is prepared. When the mask preparation work has been completed with the procedures described above, the operation advances to step 560 wherein prepared mask data is stored in the mask data storage memory 532 and the just-mentioned procedure is completed.

Figure 25:
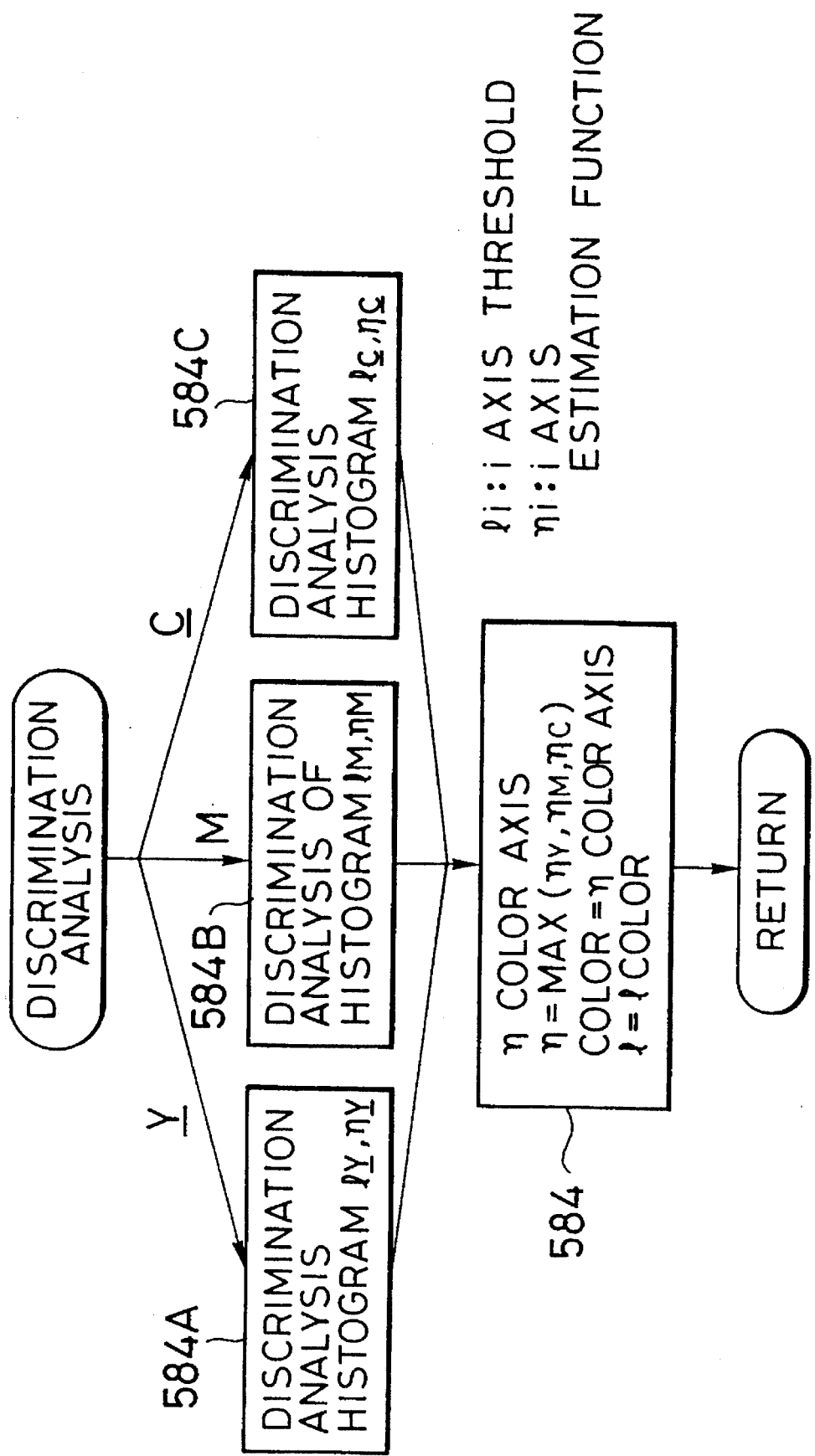
FIG. 25 is likewise a flowchart illustrating a discrimination analysis processing routine.
Figure 26:
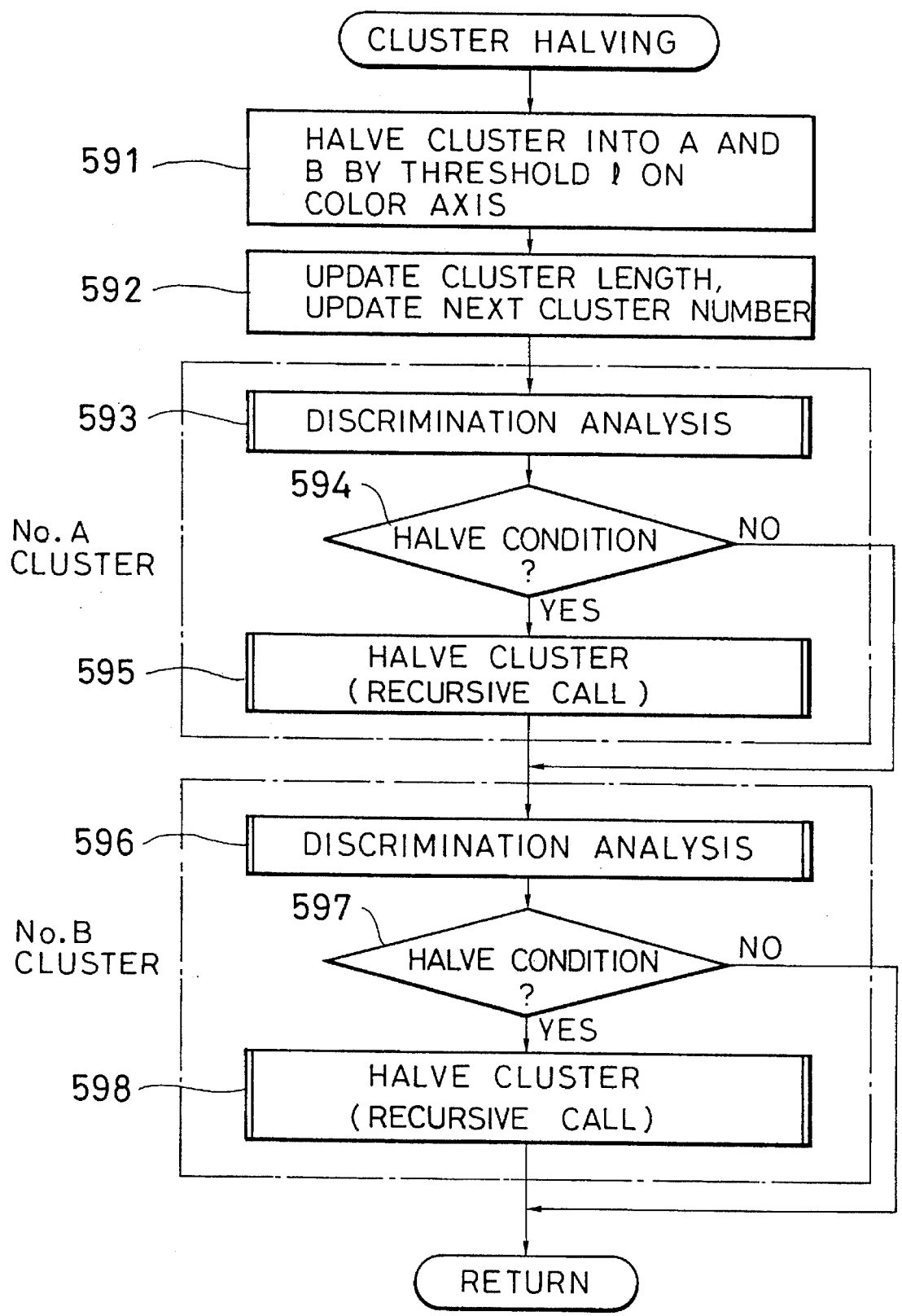
FIG. 26 is likewise a flowchart illustrating a cluster halving routine.

Herein, the details of the clustering in the step 554 are as follows. The clustering follows the procedure (clustering procedure) of FIG. 24. Details of a routine in this procedure are illustrated in FIGS. 25 and 26.

In the clustering procedure, such a cluster table as illustrated in FIG. 27 is output. The cluster table lists information such as cluster numbers and extents of picture element values of yellow (Y), magenta (M), and cyan (C) of each cluster, etc.

Figure 24:
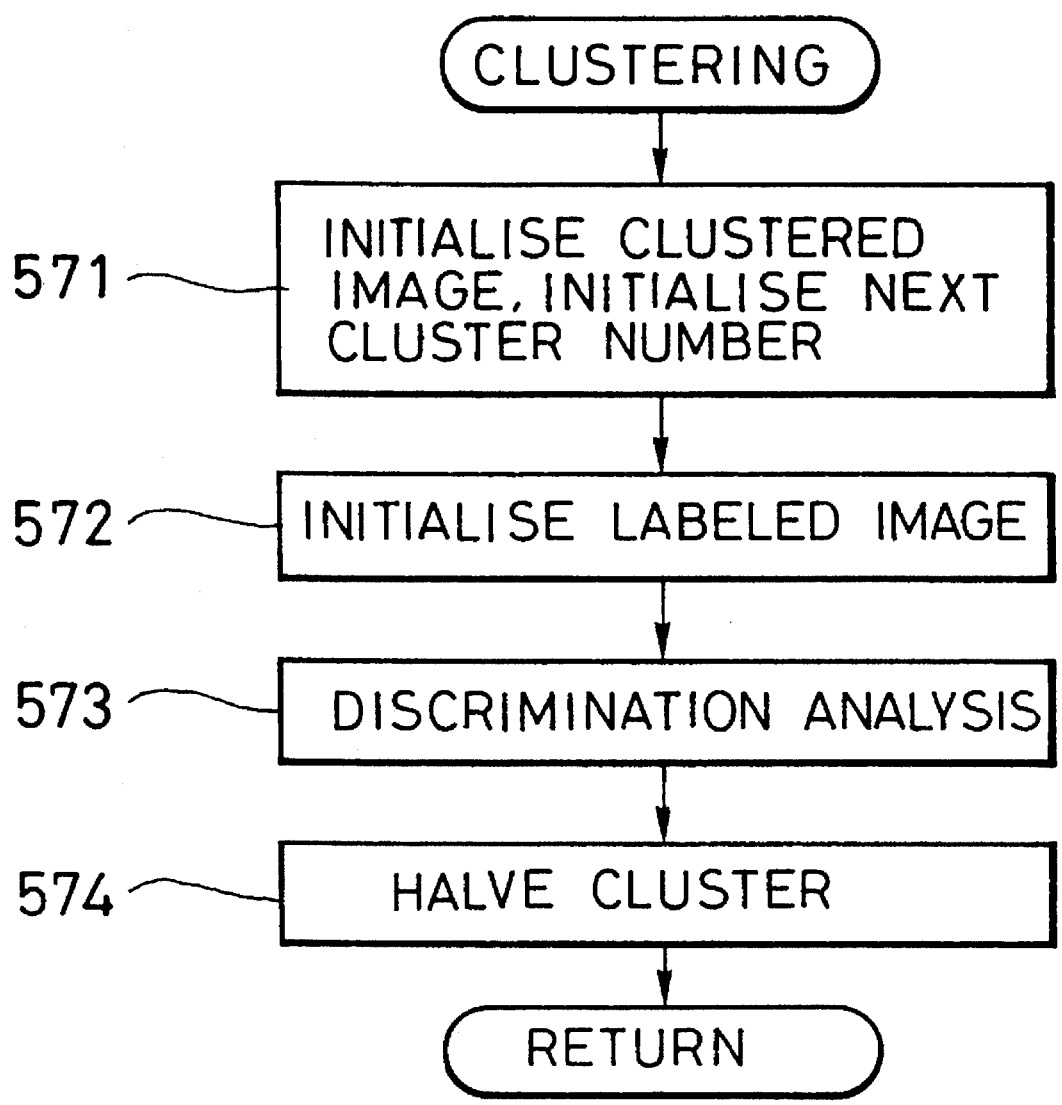
FIG. 24 is likewise a flowchart illustrating a clustering procedure.

With the starting of the clustering procedure of FIG. 24, in step 571, the cluster table is cleared to provide initial values, and the extent of the whole color space is written in a first (cluster number A) column of the cluster table and a next cluster number is initialized. Herein, the next cluster member is that of a column to be filled next to the column which is presently filled with the data, and a cluster number B is written in this column in FIG. 27.

Then, in step 572, all picture elements of a labelled image (which corresponds to each picture element in the training area and has the number of a cluster to which each picture element belongs) are initialized with the number of cluster of the number A.

Then, in step 573, a discrimination analysis routine is called. The discrimination analysis routine is illustrated in FIG. 25, in which in steps 584A through 584C, histograms on respective color axes of Y, M, C are taken for the whole image data, and optimum thresholds $1_Y$, $1_M$, $1_C$ and the degrees of separations (estimating function values indicative of the appropriateness of the separation of any cluster) $\eta_Y$, $\eta_M$, $\eta_C$ for Y, M, C colors are estimated. Then, in step 585, the highest separation axis among the color axes is discriminated, and the color, separation ($\eta$), and threshold (1) information of that color axis are returned to the clustering procedure. Herein, for the discrimination analysis, there is known a technique disclosed for example in "Automatic threshold selection by Discrimination/Least Square Reference" Nobuyuki Otsu, Journal of Electronical telecommunication Society, Vol J 63—J, No. 4, 1980.

Then, in step 574 of FIG. 24, clusters are divided into two groups by a cluster halving routine.

The cluster halving routine in the step 574 is illustrated in its detail in FIG. 26.

In the cluster halving routine of FIG. 26, in step 591, on the basis of the Color, threshold 1 information returned in the discrimination analysis routine, a cluster region is divided into two groups (cluster halving) axially of each color by the threshold 1. Then, in step 592, there is designated to clusters in a range less than the threshold the original cluster number (A in the first place), while being assigned to clusters exceeding the threshold the next cluster number B, and data of the respective clusters is input for the cluster numbers A and B and the cluster table is updated. Thereupon, the next number (C next to B) is assigned to the next cluster number and updated.

Then, in step 593, the discrimination analysis routine shown in FIG. 25 is executed with respect to the picture data included in the number A cluster to estimate the axis of the Color which is divided, the degree of the separation $\eta$ and the threshold $1_0$. Accordingly, in the case where in step 594 the division condition (in the case where the degree of the separation $\eta$ exceeds a certain value for example) is satisfied, the operation advances to step 595 in which the cluster halving routine is recursively called by itself and repeated until clustering of picture elements included in the number A clusters is all completed.

On the other hand, in the case where the division condition is not satisfied, the operation advances to step 596, in which the same processings from the discrimination analysis to the classification of clusters as in the steps 593 through 595 are executed with respect to the picture elements included in the number B clusters (steps 596 through 598).

Figure 28:
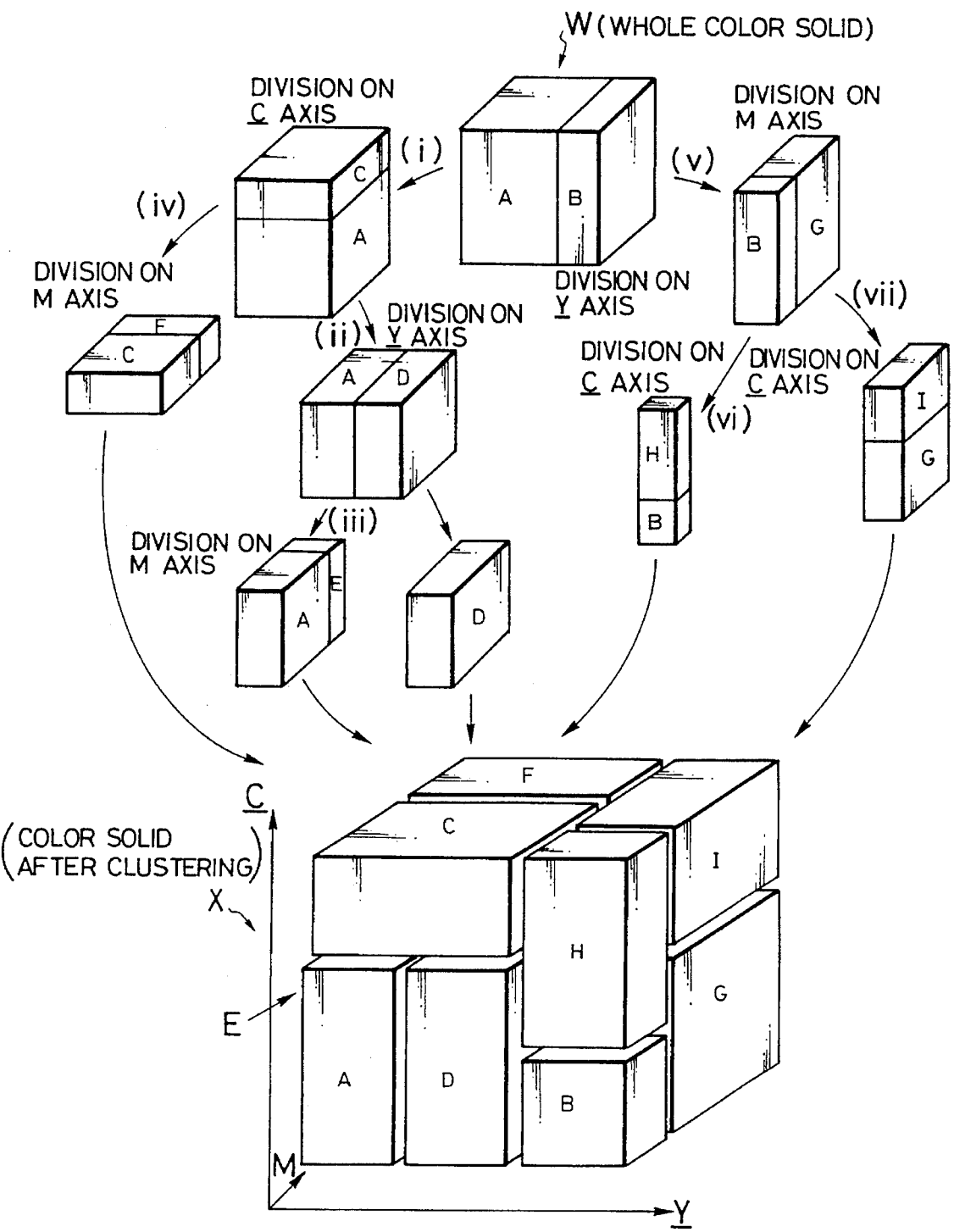
FIG. 28 is likewise a perspective view illustrating color block division for describing a clustering processing concept.

Herein, the clustering will be described on the basis of a color solid of FIG. 28 for example. The color solid shown in FIG. 28 is assumed to be existent in a color space where the axis of horizontal axis is Y, the vertical axis is M, and the height axis is C.

The whole color solid (indicated by a symbol W in the figure) is subjected to the discrimination analysis, whereby the degree of the separation on the axis Y is found to be high, so that the solid is divided with the threshold 1 on the axis Y into the A and B clusters and the next cluster number is taken as C.

The number A cluster is clustered (indicated by a symbol (i) in the figure). When the number A cluster is subjected to the discrimination analysis, the degree of the separation on the axis C is maximum to satisfy the division condition, so that clusters in a range less than the threshold 1 are updated to the number A clusters, and numbers of clusters in a range exceeding the threshold are taken as C on the basis of the next cluster number. Next cluster number is updated to D.

Since the number A clusters after the clustering (i) satisfy the division condition, they are divided to number A and D clusters on the axis Y for example. The next cluster number is assumed to be E (indicated by a symbol (ii) in the figure).

Since the number A clusters after the clustering (ii) satisfy the division condition, they are divided to clusters of the numbers A and E on the axis M, for example. The next clusters number is assumed to be F (indicated by a symbol (iii) in the figure). In this case, since the number A, E, D clusters after the clustering (iii) do not satisfy the division condition, they are left as they are and are not divided further.

Since the number C clusters divided as indicated by a symbol (i) of the figure satisfy the division condition, they are divided to number C and F clusters on the axis H. The next cluster number is taken as G (indicated by a symbol (iv) in the figure). Herein, the number C and F clusters do not satisfy the division condition, they are left as they are, and not divided further.

Since the number B clusters satisfy the division condition, they are divided to the number B and G clusters on the axis H. The next cluster number is taken as H (indicated by a symbol (v) in the figure).

Since the number B clusters after the clustering satisfy the division condition, they are divided to number B and H clusters on the axis C, and the next cluster number is taken as I (indicated by a symbol (vi) in the figure).

In this case, since the number B and H clusters do not satisfy the division condition, they are left as they are and not divided further.

Since number G clusters satisfy the division condition, they are divided to the number G and I clusters on the axis C. The next cluster number is assumed to be J (indicated by a symbol (vii) in the figure).

In this case, since the number G and I clusters do not satisfy the division condition, they are left as they are, and not divided further.

The clustering of the whole color solid is completed as described above. Provided color solids are combined with respect to the number A through I clusters after the clustering, the original color solid W is to be divided to nine number A through I clusters as indicated by a symbol X in FIG. 28.

After the completion of the clustering in the step 554 of FIG. 23, the operation advances to step 555 in which representative colors are assigned to the respective divided clusters. For those representative colors, the center point of cluster or the center of gravity of picture elements in each cluster is useable. The representative colors are displayed on the screen of the display section 515. Herein, provided the color of each picture element in a training area in the image is replaced by the representative color of a cluster to which the just-mentioned picture element belongs, and displayed, it is possible to confirm a cluster distribution.

After the step 555 is completed, the operation returns to the step 552 and further advances to step 556 by being selected by the operator. In step 550, the operator observes the representative colors of the respective clusters displayed on the display section 518 and the original image or an image replaced by the representative colors likewise displayed on the display section 518, and instructs on the basis of his decision the ON/OFF input means 516A to designate which cluster belongs to the background region.

After the designation is completed, the operation returns to step 552, and advances by the selection. In the step 557, a cutting area position is input by the position input means 516B, and picture element data in the cutting area is inputted into the binary calculation means 530. Then, the operation advances to step 558 in which the binary calculation means 530 binary-codes the cutting area using data listed on the cluster table concerning clusters designated as belonging to the background region (background clusters) to prepare mask data. In this situation, provided the image data belongs to the background clusters, then mask data for those picture elements are made ON, and otherwise the mask data is made OFF.

Then, in step 559, the prepared mask data is displayed, and if the mask data is a desired one, then the operation advances to step 560 in which the mask data is stored in the mask data storage memory 532. Hereby, the mask preparation procedure is completed.

Herein, although in the embodiment of the ninth invention the color space with the Y, M, C color axis were exemplified as the color space for an image, the color space taken into consideration upon execution of the ninth invention is not limited thereto. For example, besides the above color space, there are useable a color space with red (R), green (G), and blue (B) color axes and X color spaces with brightness Y, chromaticities I, Q axes and with hue H, lightness V, saturation C axes for example to cluster color image data for preparation of a cutting mask.

What is claimed is:

1. A cutting mask preparation method for preparing a cutting mask of color image data displayed on a monitor screen, said method comprising the steps of:

a) designating at least one training area for the displayed color image;

b) statistically analyzing said color image data in said at least one training area, and clustering a color distribution generated from said color image data in said at least one training area into a plurality of clusters based on the analysis so as to divide said color distribution into said plurality of clusters, said color distribution existent in a color space defined by color axes, each of said plurality of clusters defined by said color axes, said plurality of clusters formed by examining said color distribution along a selected one of said color axes to form intermediate clusters and repeatedly examining intermediate clusters along selected ones of said color axes to further form additional intermediate clusters until a classification termination condition is satisfied;

c) assigning a representative color to each one of the divided clusters, and designating at least one of the plurality of clusters to a background region, referring to said representative color;

d) designating a cutting area to said displayed color image data; and e) binary-coding said displayed color image data within said designated cutting area to prepare the cutting mask by classifying pixel data within the designated cutting area as belonging to said at least one of said plurality of clusters designated to the background region.

2. The cutting mask preparation method as set forth in claim 1, wherein said statistical analysis and clustering are conducted by performing histogram discriminant analysis on each axis of the color distribution with respect to said color image data in said at least one training area, and said color image data is clustered along the axis of said plurality of axes having the greatest degree of separation of data of said color image.

3. The cutting mask preparation method as set forth in claim 1, wherein the pixel data within the designated cutting area is determined based on an estimating function prepared for each respective cluster, said estimating function indicating a possibility that an arbitrary color belongs to said respective cluster.

* * * * *